US007105836B2

(12) United States Patent  (10) Patent No.: US 7,105,836 B2
del Puerto et al.  (45) Date of Patent: Sep. 12, 2006

(54) METHOD AND APPARATUS FOR COOLING A RETICLE DURING LITHOGRAPHIC EXPOSURE

(75) Inventors: Santiago del Puerto, Milton, NY (US); Daniel N. Galburt, Wilton, CT (US); Andrew W. McCullough, Newtown, CT (US); Stephen Roux, New Fairfield, CT (US); Joost Jeroen Ottens, Veldhoven (NL)

(73) Assignee: ASML Holding N.V., Veldhoven (NL)

( * ) Notice: Subject to any disclaimer, the term of this patent is extended or adjusted under 35 U.S.C. 154(b) by 718 days.

(21) Appl. No.: 10/273,405

(22) Filed: Oct. 18, 2002

(65) Prior Publication Data

US 2004/0079518 A1   Apr. 29, 2004

(51) Int. Cl.
*G03F 7/20* (2006.01)
*F25B 29/00* (2006.01)
*H01J 37/20* (2006.01)

(52) U.S. Cl. .............................. 250/492.2; 250/443.1; 355/30; 355/53; 355/72; 355/75; 378/34; 165/80.1; 165/80.2; 165/80.3; 165/80.4; 165/86

(58) Field of Classification Search ............... None
See application file for complete search history.

(56) References Cited

U.S. PATENT DOCUMENTS

| | | | |
|---|---|---|---|
| 3,171,956 A | 3/1965 | Coleman et al. | |
| 4,226,281 A * | 10/1980 | Chu | 165/80.2 |
| 5,289,337 A * | 2/1994 | Aghazadeh et al. | 361/718 |
| 5,325,180 A * | 6/1994 | Chappelow et al. | 356/401 |
| 5,801,891 A * | 9/1998 | Lloyd | 359/871 |
| 5,944,097 A | 8/1999 | Gungor et al. | |
| 6,215,642 B1 * | 4/2001 | Sogard | 361/234 |
| 6,496,528 B1 * | 12/2002 | Titus et al. | 372/102 |
| 6,705,388 B1 * | 3/2004 | Sorgo | 165/80.3 |
| 6,809,802 B1 * | 10/2004 | Tsukamoto et al. | 355/72 |
| 6,810,298 B1 * | 10/2004 | Emoto | 700/121 |
| 2002/0027644 A1 | 3/2002 | Bisschops | |
| 2003/0035088 A1 * | 2/2003 | Emoto | 355/53 |

FOREIGN PATENT DOCUMENTS

EP   0 484 179 A2   5/1992

(Continued)

OTHER PUBLICATIONS

European Search Report from European Patent Application No. 03023662.4, dated Aug. 31, 2005, 6 pages.

(Continued)

*Primary Examiner*—Jack I. Berman
(74) *Attorney, Agent, or Firm*—Sterne, Kessler, Goldstein & Fox P.L.L.C.

(57) ABSTRACT

Systems and methods eliminate vibrations produced by coolant fluid flowing through a short stroke stage and prevent change in thermally-induced distortion of the short stroke stage by maintaining the temperature and temperature distribution within the short stroke stage constant regardless of actinic heat load incident on a reticle. This is done by: (1) conducting heat through the reticle and short stroke stage components, (2) radiatively transferring heat from the short stroke stage to a long stroke stage, and (3) using convection and a cooling system to dissipate heat from the long stroke stage. The short stroke stage can be magnetically levitated from the long stroke stage. This way there is no physical contact, but the long stroke stage's movements can still control the short stroke stage's movements. By not physically contacting the long stroke stage, the short stroke stage is not affected by vibrations in the long stroke stage caused by the flowing coolant.

8 Claims, 29 Drawing Sheets

FOREIGN PATENT DOCUMENTS

| | | |
|---|---|---|
| EP | 1 120 690 A2 | 1/2001 |
| EP | 1 077 393 A2 | 2/2001 |
| EP | 1 124 161 A2 | 8/2001 |
| EP | 1 124 161 A3 | 8/2001 |
| EP | 1 286 221 A2 | 2/2003 |
| EP | 1 286 221 A3 | 2/2003 |
| JP | 2003 068626 | 3/2003 |

OTHER PUBLICATIONS

Copy of European Search Report for European Appln. 200306240-3 mailed Jun. 9, 2004.

Japanese Abstract for Japan Appln. JP 2003 068626 published Mar. 7, 2003.

* cited by examiner

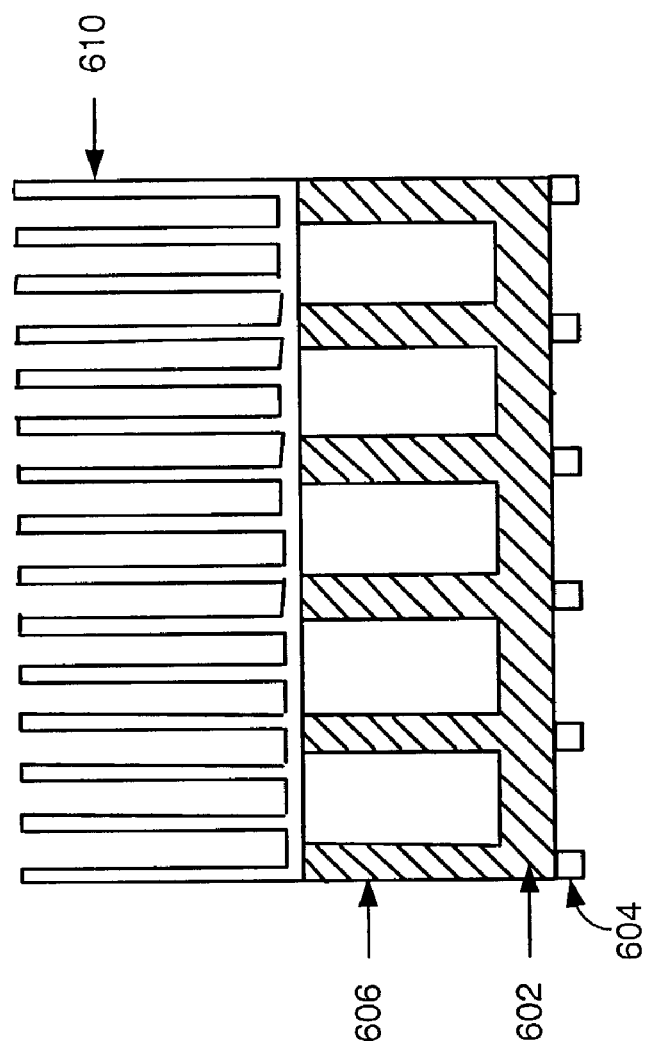

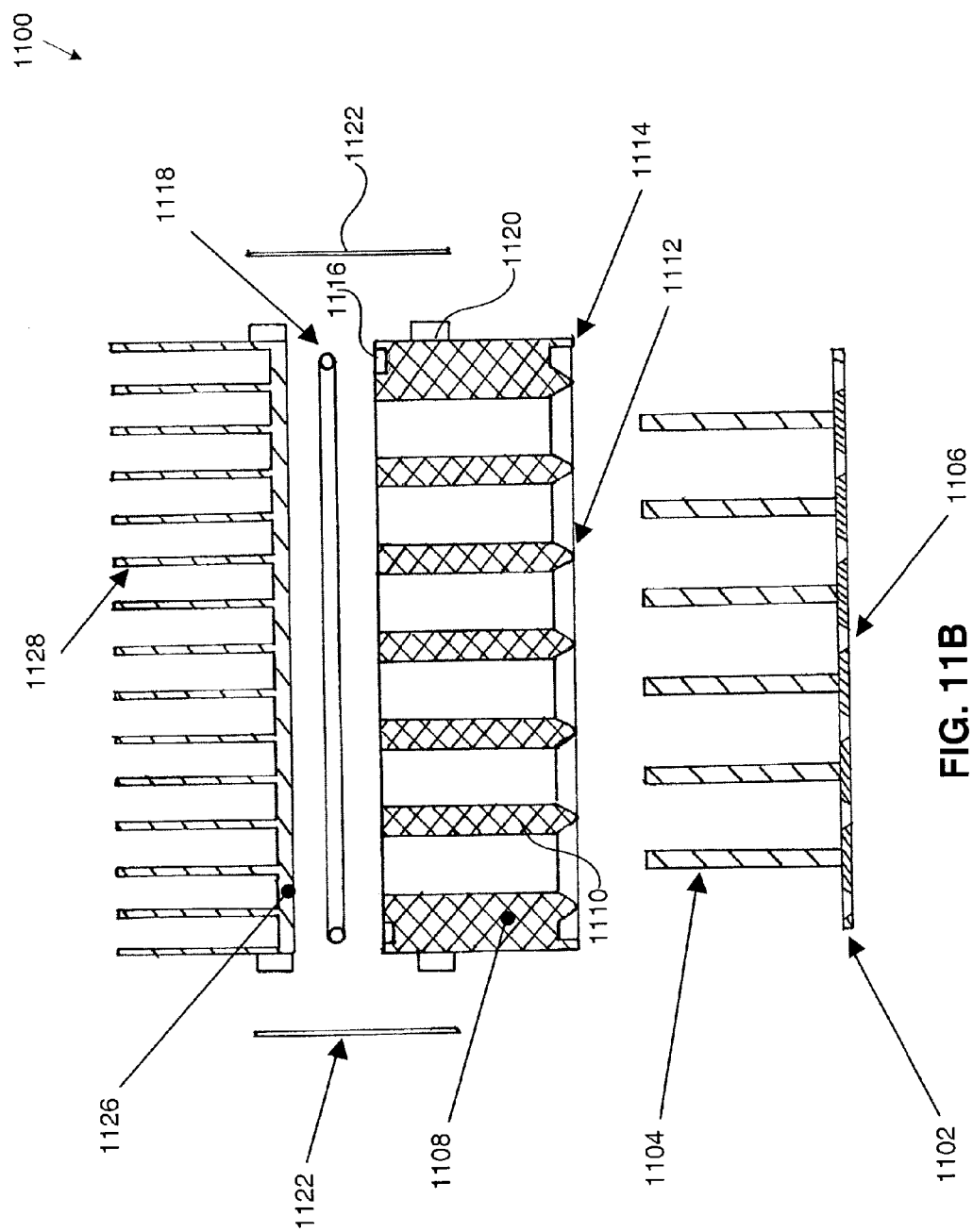

METHOD AND APPARATUS FOR COOLING A RETICLE DURING LITHOGRAPHIC EXPOSURE

BACKGROUND OF THE INVENTION

1. Field of the Invention

The present invention relates to heat dissipation from a reticle in an extreme ultra violet lithography tool.

2. Background Art

In advanced optical lithography, a master pattern on a substrate, referred to as a reticle, is copied onto a wafer by projecting deep ultra violet (DUV) light through, or reflecting extreme ultra violet (EUV) light off of the reticle, and then passing that light through imaging optics on to a wafer. The requirement to copy on to the wafer sub-micron features requires the wafer and reticle be held in a precise relationship with respect to the imaging optics. In the case of a DUV step and scan lithography tool the reticle is usually held to a reticle stage by vacuum, but for an EUV tool, where a vacuum is required for EUV transmission, electrostatic force is used in place of vacuum. The mechanical interface between the reticle and its stage is called a chuck.

In general, the reticle is heated by the exposure illumination and as a result the reticle is distorted. For most DUV tools the reticle substrate is low expansion fused silica and the temperature rise of the reticle is limited by heat transfer mechanisms enhanced by the atmosphere so that the resulting distortion is kept to acceptable levels. For a EUV tool, however, where features smaller than 30 nm will be imaged, and where the heat load on the reticle is higher, thermal distortion is a greater problem. EUV reticles are typically near zero expansion materials such as Ultra Low Expansion (ULE) glass. Even with this advantage, given the vacuum environment, and low infrared emissivity of the reticle, thermal distortion requires more attention to cooling.

In a typical EUV chuck design the reticle is held by electrostatic force against the pimpled surface of an electrostatic clamp. Gas may be injected between the reticle and clamp to promote good heat transfer from the reticle to the reticle stage. Further cooling fluid may be circulated in passages in the chuck behind the electrostatic clamp to limit temperature rise and resultant distortion. The electrostatic clamp is attached to a rigid, near zero expansion structure that also holds the metrology references for the reticle stage positioning system.

To achieve the required accuracy the reticle stage may incorporate magnetic levitation to allow ultra precise control of the reticle position. The magnetically levitated portion of the reticle stage is referred to as the short stroke stage and is made up of a low expansion stiff structure, force actuators, metrology references, and the reticle chuck. The short stroke module reacts against a long stroke stage that moves along the scanning axis. The short stroke stage can be designed with an integral chuck, or a separate chuck module the can be removed from the short stroke structure. In either case, it is highly desirable not to run liquid on to the short stroke because the vibration introduced by the fluid flow and the dynamic characteristics of the connecting hoses reduce pattern positioning accuracy. Cooling fluids are run to the long stroke stage to cool actuator coils and because of the high degree of isolation provided by magnetic levitation cause no significant problem.

FIG. 1 shows a conventional system 100 including a short stroke stage portion 102. The short stroke stage portion 102 includes a reticle 104 and a thin front plate 106 of a chuck (a combination of elements 108 and 112), the two being separated by a gas gap 106. Water flows through a heat removal section 110 positioned "below" front plate 108. Below heat removal section 110 there is a stiff structure 112 of the chuck.

Reticle 104 is placed on a reticle stage that includes the short stroke stage (interchangeably referred to as short stroke stage or SS throughout) for fine positioning and a long stroke stage (not shown in this figure) (interchangeably referred to as long stroke stage or LS throughout) for coarse positioning. Typically, these stages are connected together and at least one is cooled using a flowing fluid. In most cases, optics are used between the reticle and the wafer to reduce the pattern before exposure and to compensate for any distortion of the pattern. Exposure is done for a series of patterns to fabricate the various layers used to form electrical devices on the wafers. In order for the fabricated devices to work properly the patterns must be overlaid with only slight variations from ideal. This is even more important in extreme ultra violet (EUV) systems because the characteristic dimensions of the devices being fabricated can be on a scale of less than 50 nanometers (nm). Even a shift of less than 10 nm from a desired to an actual position of each layer of the patterns can render all the devices on a wafer unusable.

In lithographic systems, light used for exposure can be absorbed by optical elements as well as by ambient gas. To reduce the absorption effects in EUV, the exposure process is performed in vacuum and a reflective reticle is used. An EUV reticle typically reflects less than about 60 percent of the incident light. The interaction of the light with the reticle (also called the actinic heat load) raises the temperature of the reticle, which can distort the patterns on the reticle, and thus the copied patterns on the wafers. This distortion is more troublesome in a EUV system because, as discussed above, there is very little tolerance allowed during the copying of the patterns. Also, although other systems that operate at longer wavelengths than EUV use transmissive reticles, which are far less sensitive to distortion, they cannot be used with EUV light due to complete absorption.

Cooling systems have been developed to compensate for increases in reticle temperature caused by exposure to the light. Typical cooling systems run a liquid through channels in the long and/or short stroke stage to keep the stages cool, which also cools the reticle on the short stroke stage. Unfortunately, the cooling systems vibrate the stages because of the constant flow of liquid. The vibrations can blur patterns being exposed on the wafer. Even if the cooling system is moved to the long stroke stage, vibration may still be transferred through physical connections between the long stroke stage and the short stroke stage.

Therefore, what is needed is a system and method of controlling thermal distortion of the reticle in an EUV tool without utilizing a liquid cooled reticle chuck.

Therefore, what is also needed is a system and method for providing enough surface area on a radiative coupling device of a short stroke stage to allow for effective radiative heat transfer from a reticle and through the short stroke stage. Also, what is needed is a cooling system and method for a short stroke stage holding a reticle that does not require any fluid flow through the short stroke stage and that does not require the short stroke stage to be connected to the long stroke stage to reduce unwanted vibrations.

BRIEF SUMMARY OF THE INVENTION

Embodiments of the present invention provide a system including a first stage including a radiative coupler and cooling portion and a second stage that is radiatively coupled to the first stage. The second stage includes a substrate receiving device, a uniform heat removing portion coupled to the substrate receiving device, and radiative coupler coupled to the uniform heat removing portion.

Other embodiments of the present invention provide a method of dissipating heat from a substrate. The method transfers heat from the substrate to a substrate receiving device. The method also transfers the heat from the substrate receiving device to a uniform heat removing device. The method also transfers the heat from the uniform heating removing device to a first radiative coupler. The method also radiatively transfers the heat from the first radiative coupler to a second radiative coupler. The method then dissipates the radiatively transferred heat with a cooling system.

Still other embodiments of the present invention provide a system for receiving, holding and controlling temperature of a substrate. The system includes a rigid structure having substantially zero coefficient of thermal expansion (CTE) that constrains the substrate. The system also includes a heat removal portion having a larger CTE and thermal conductivity than the rigid structure that removes excess heat from the substrate. The system also includes means for thermally coupling the substrate to the heat removal portion. The system also includes means for thermally isolating the heat removal portion from the rigid structure. The system also includes means for mechanically coupling the heat removing portion to the rigid structure. The system also includes radiative means for removing excess heat from the heat removal portion.

An advantage of the above embodiments is that substantially all the power absorbed by the substrate (e.g., approximately 12 W) is removed.

Another advantage of the above embodiments is that the substrate is maintained at a desired mean temperature (e.g., approximately 22° C.).

A still further advantage of the above embodiments is that in-plane distortion of a reticle if the substrate is a reticle, and thus the reticle pattern, is limited to a desired tolerance (e.g., less than 2 nm (1 nm=$\frac{1}{1000}$ mm=$1 \times 10^{-9}$ m)).

A still further advantage of the above embodiments is that out-of-plane distortion of a reticle if the substrate is a reticle, and thus the reticle pattern, is limited to a desired tolerance (e.g., less than 50 nm).

A still further advantage of the above embodiments is that an initial bowing of the substrate is flattened (e.g., from a 1.5 mm bow to approximately a 50 nm bow).

A still further advantage of the above embodiments is that the systems and methods are compatible with a high vacuum environment.

A still further advantage of the above embodiments is that the systems and methods accommodate relative motion between the short stroke stage (e.g., the precision or fine stage) to which a substrate holder (e.g., chuck), is mounted and the long stroke stage (e.g., coarse or sub-stage), which levitates and propels the short stroke stage.

A still further advantage of the above embodiments is that the systems and methods allow for the relative motion between the short stroke stage and the long stroke stage (e.g., a working gap, gap, etc.) to be a desired distance (e.g., approximately 1.5 mm) for lithographic tool design.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 6B:
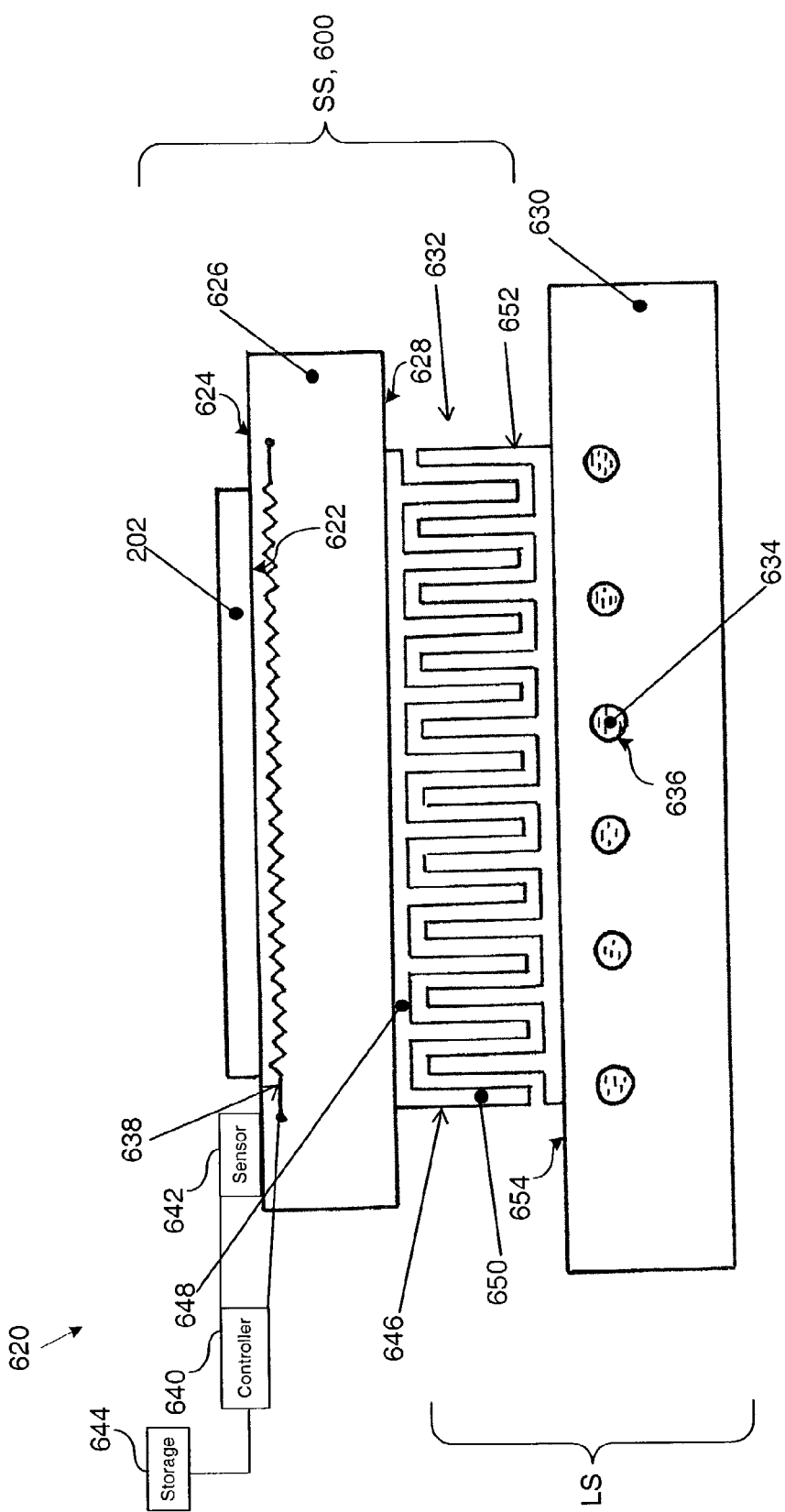
Figure 6C:
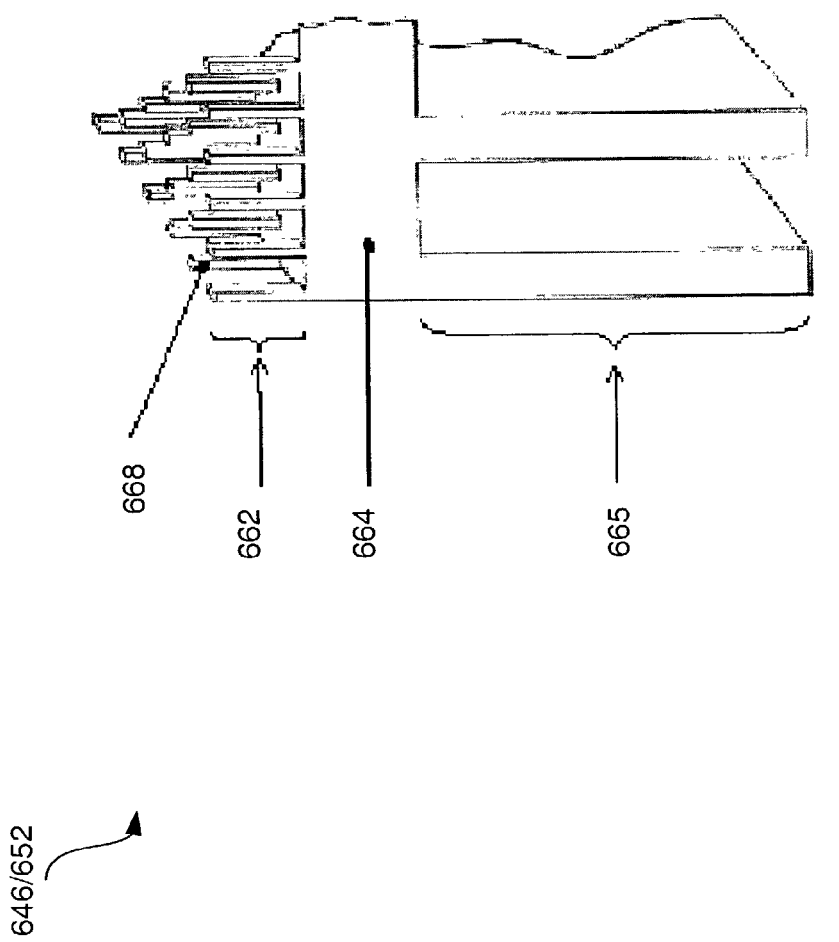

FIGS. 6A, 6B, and 6C show cross sectional views of portions of a reticle holding system according to embodiments of the present invention.

Figure 6D:
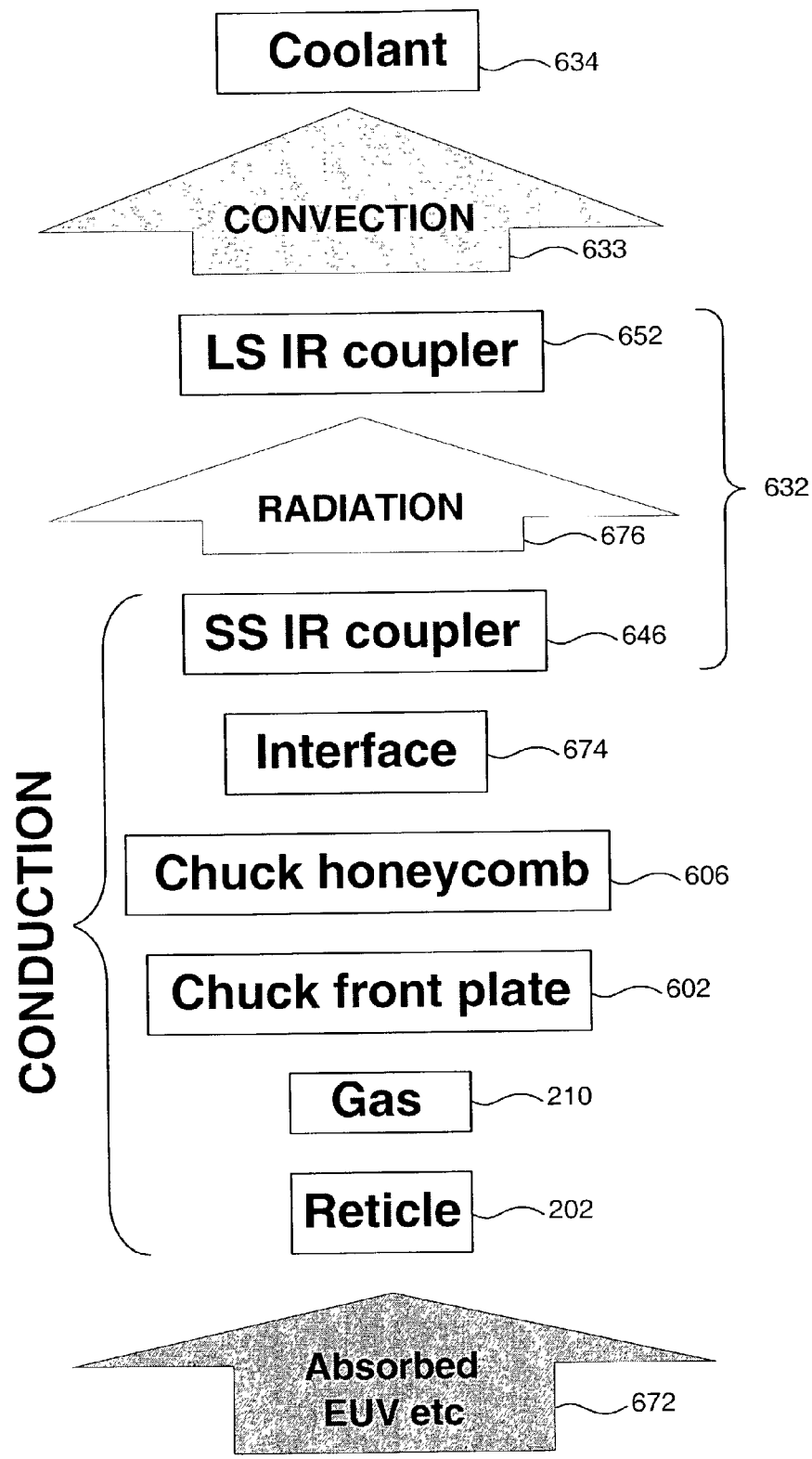

FIG. 6D is a heat flow diagram of heat generated from light absorption in a reticle through the reticles and a portion of a lithographic system of FIGS. 6A–C.

Figure 7A:
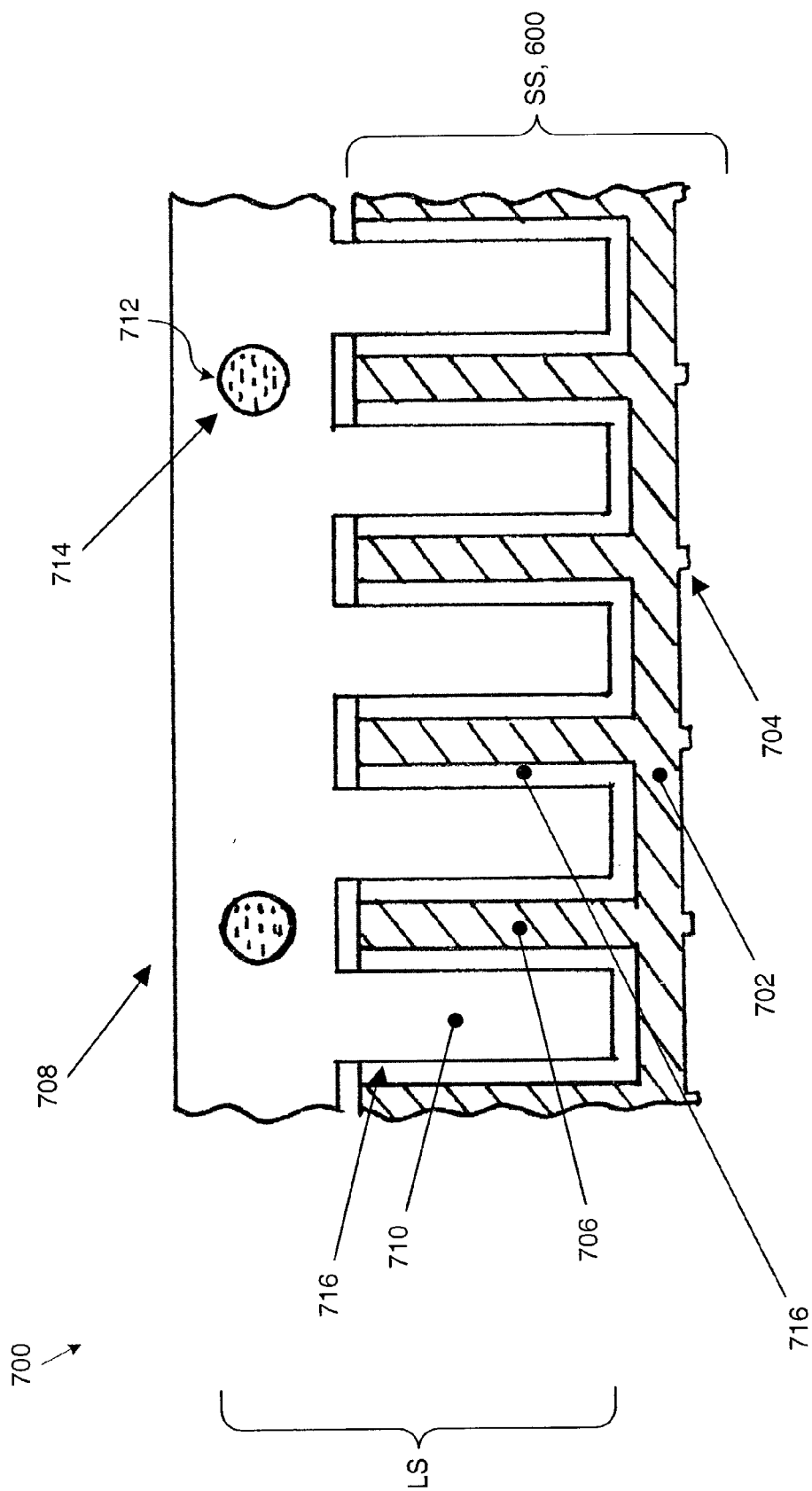

FIG. 7A is a cross sectional view of portions of a reticle holding system according to embodiments of the present invention.

Figure 7B:
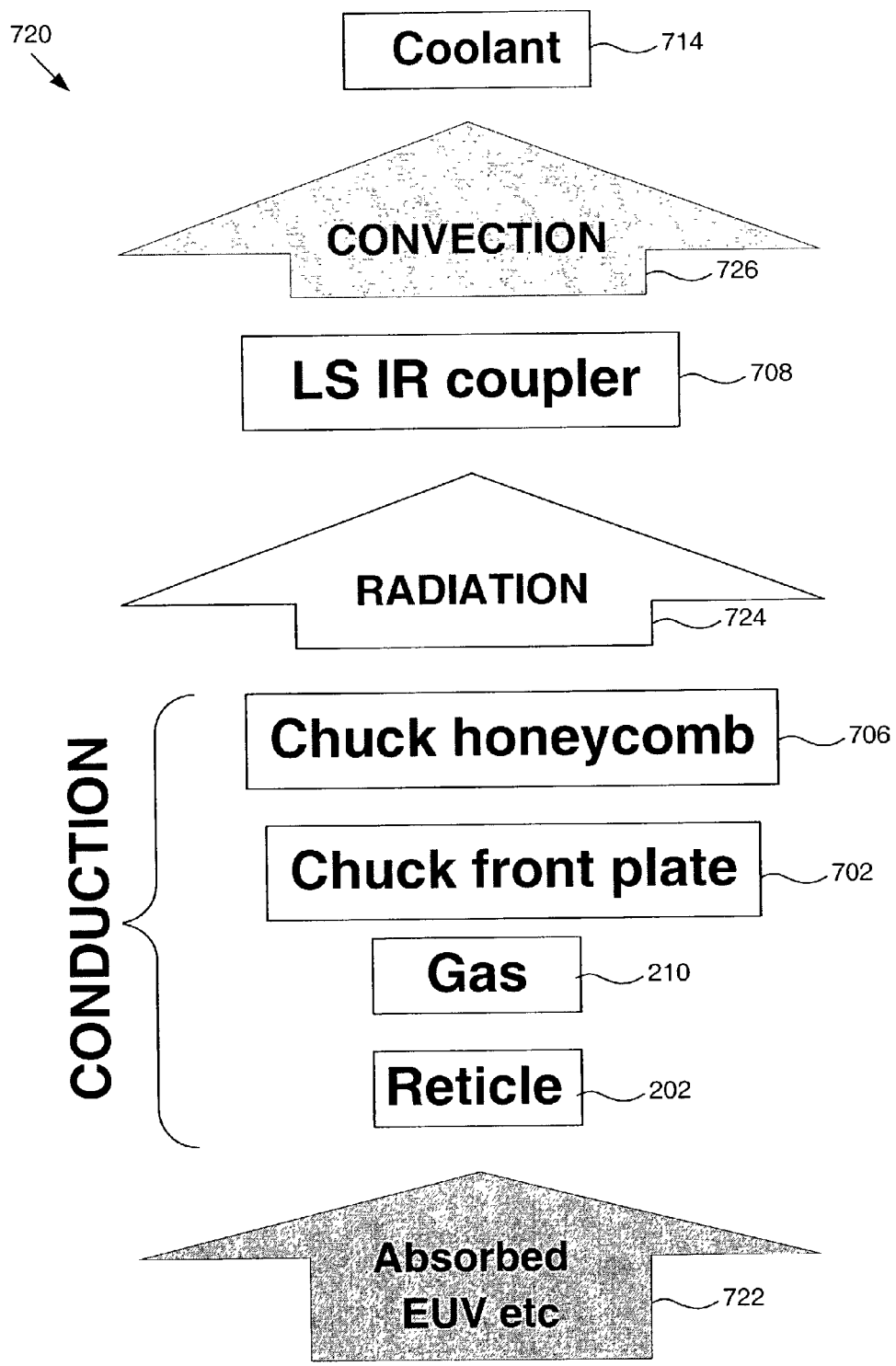

FIG. 7B is a heat flow diagram of heat generated from light absorption in a reticle through the reticles and a portion of a lithographic system of FIG. 7A.

Figure 8A:
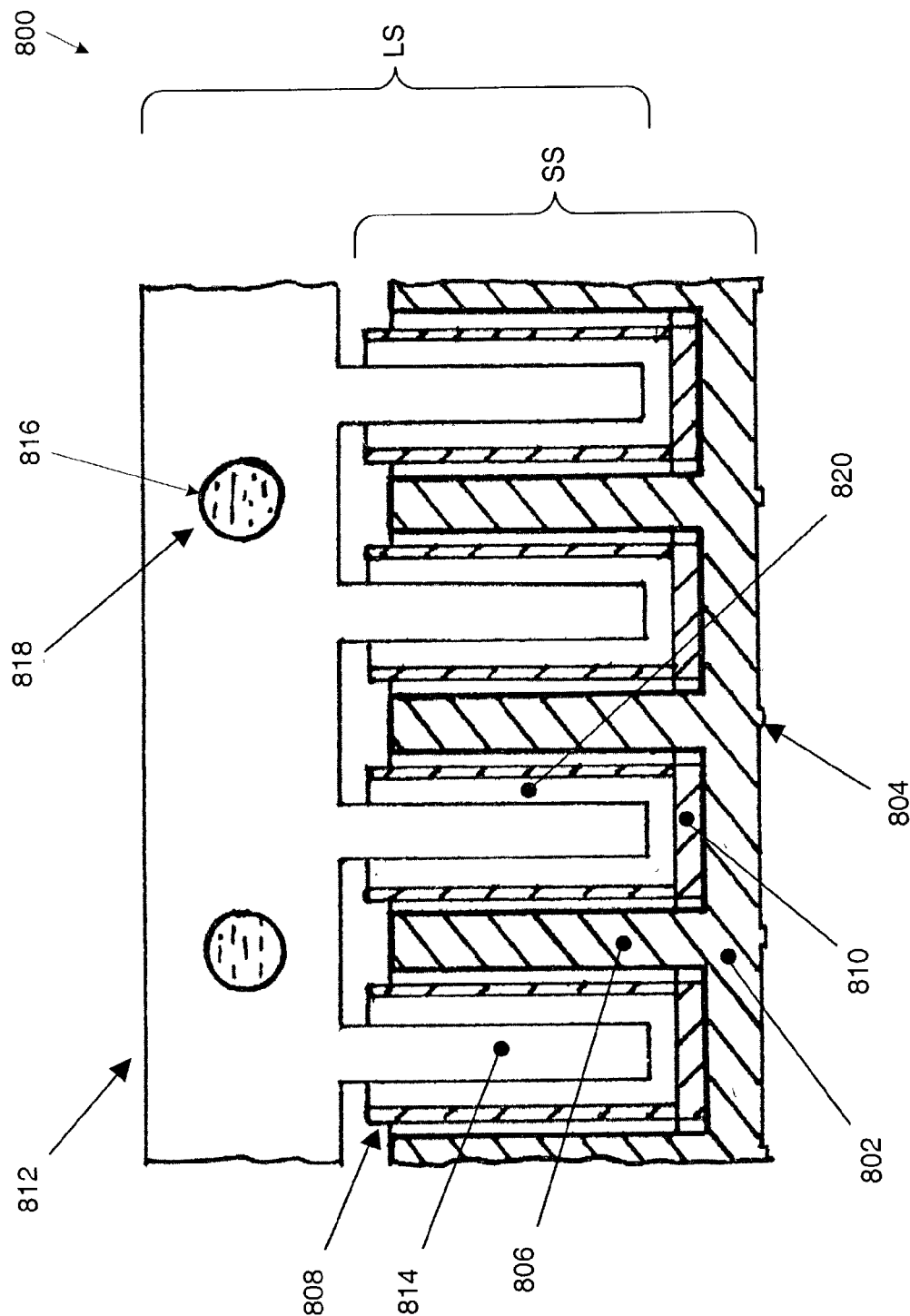

FIG. 8A is a cross sectional view of portions of a reticle holding system according to embodiments of the present invention.

Figure 8B:
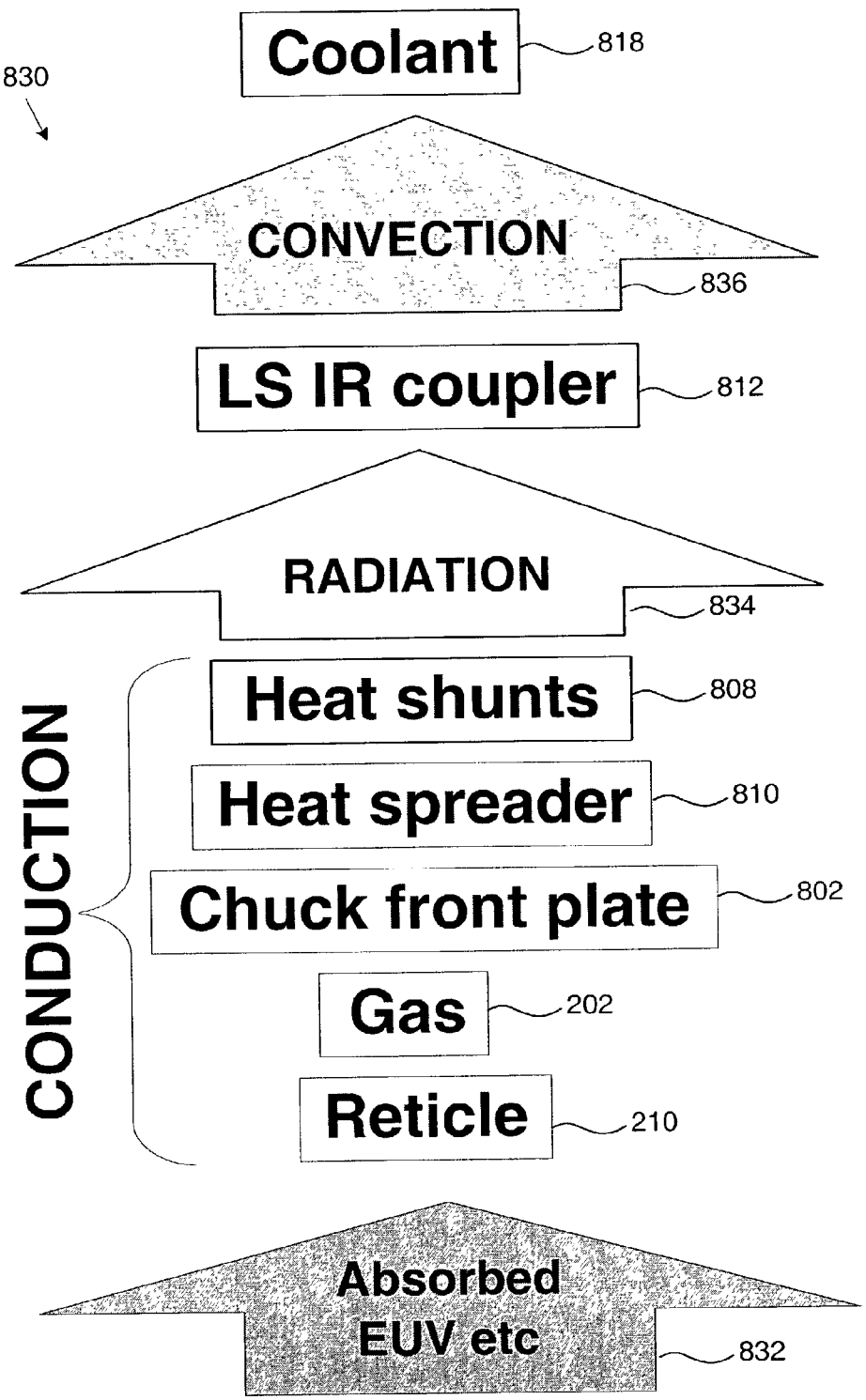

FIG. 8B is a heat flow diagram of heat generated from light absorption in a reticle through the reticles and a portion of a lithographic system of FIG. 8A.

Figure 9A:
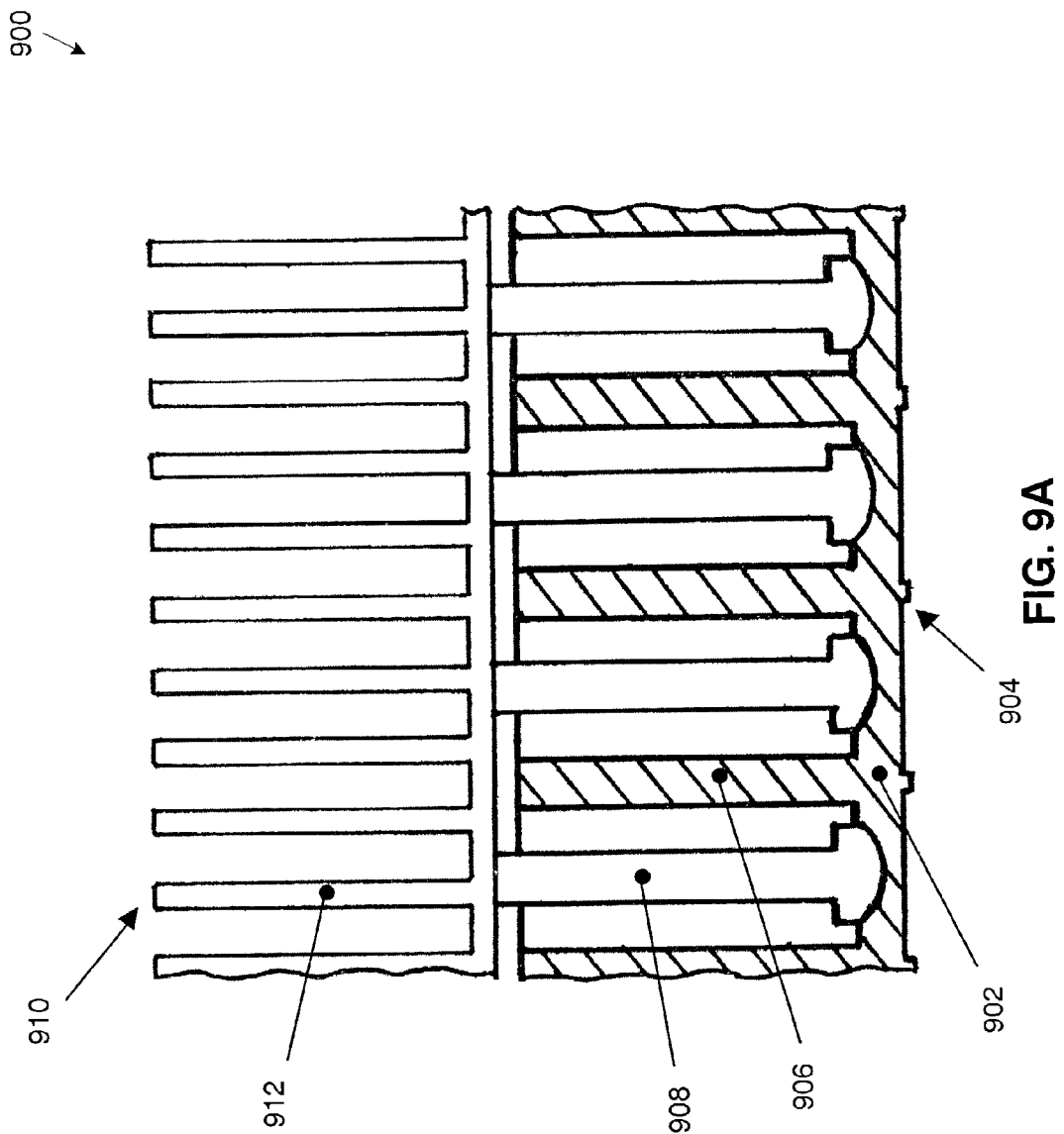

FIG. 9A is a cross sectional view of portions of a reticle holding system according to embodiments of the present invention.

Figure 9B:
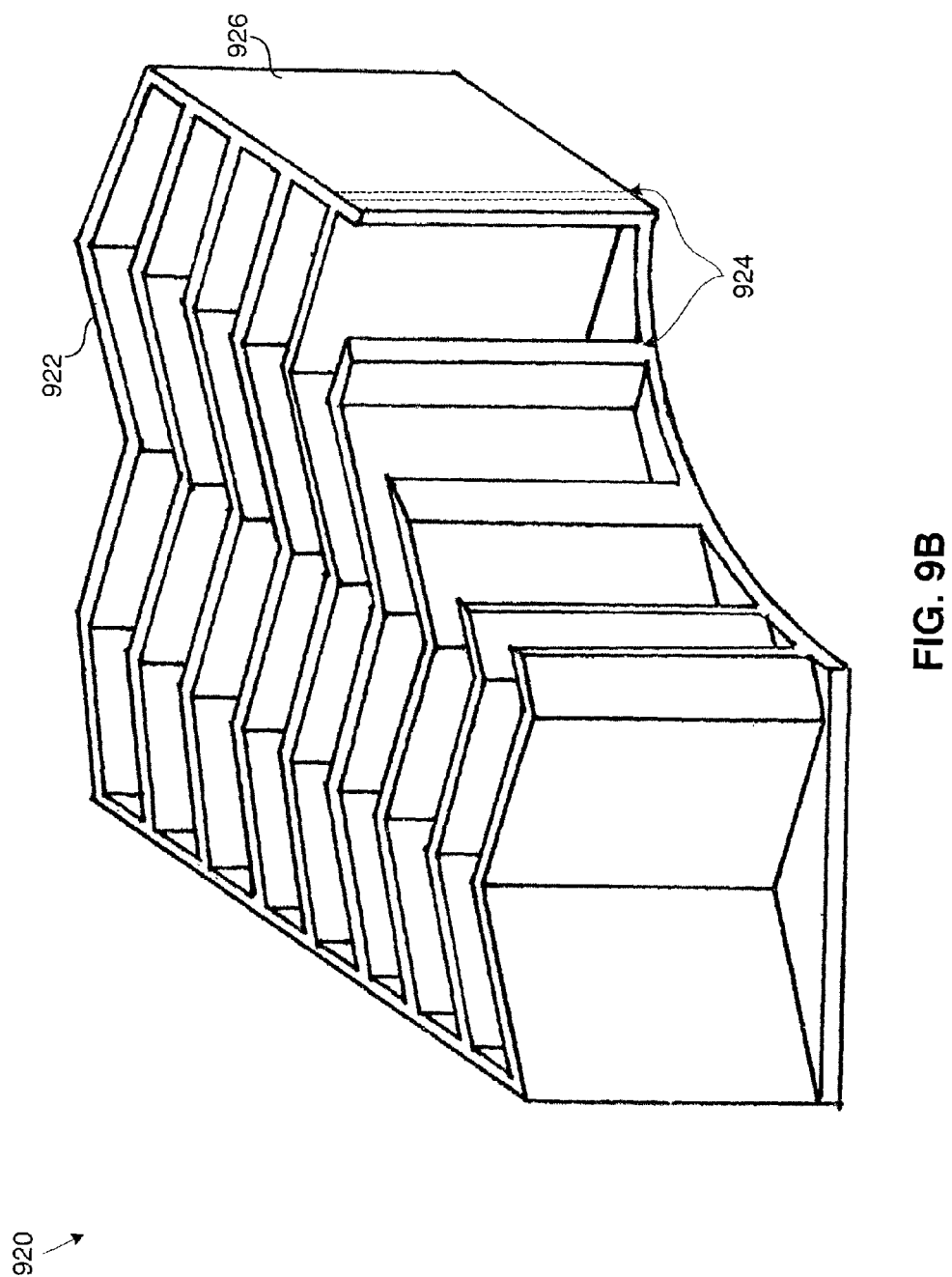

FIG. 9B shows a radiative coupler structure in a portion of a reticle holding system according to embodiments of the present invention.

Figure 9C:
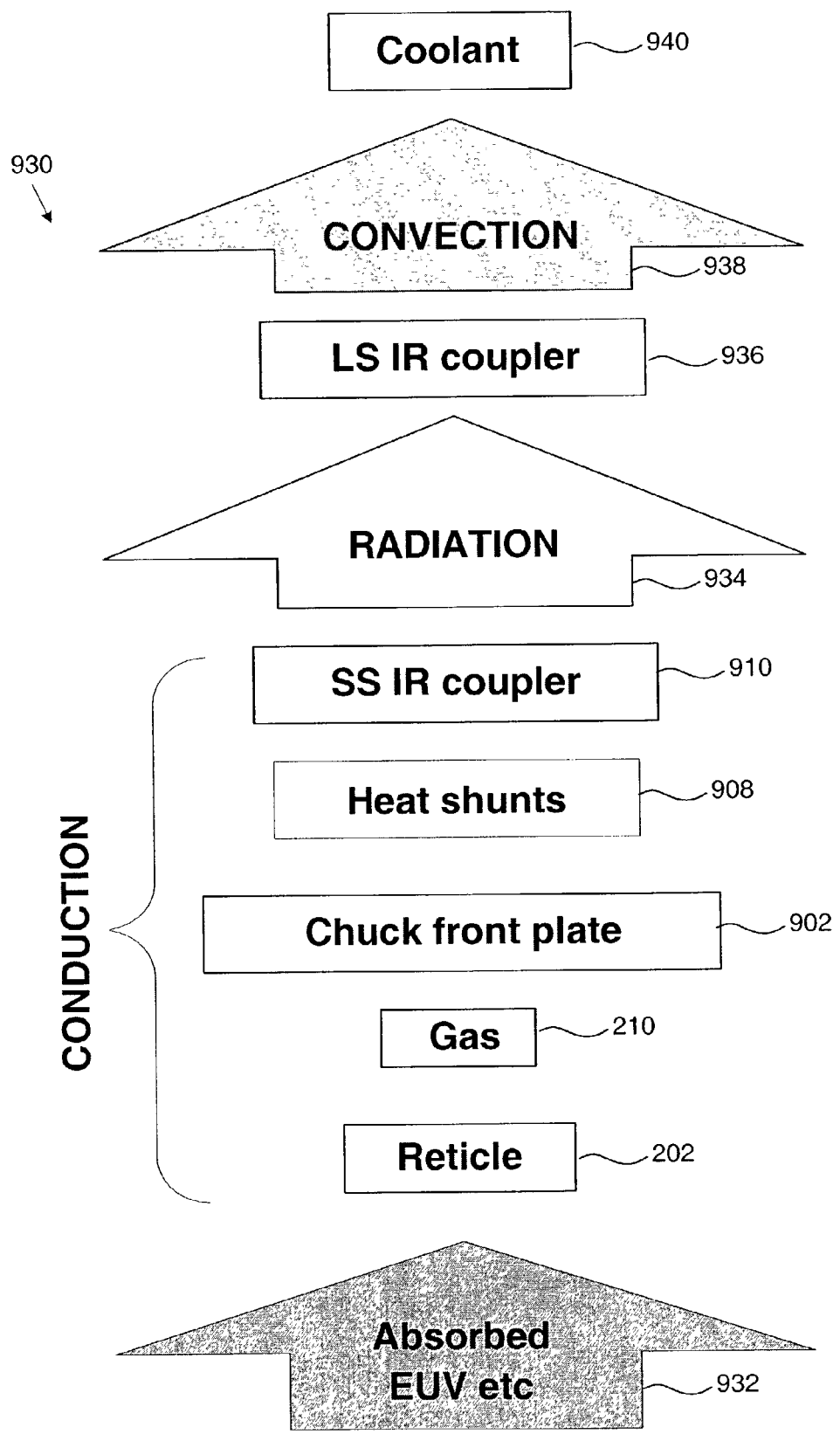
Figure 9D:
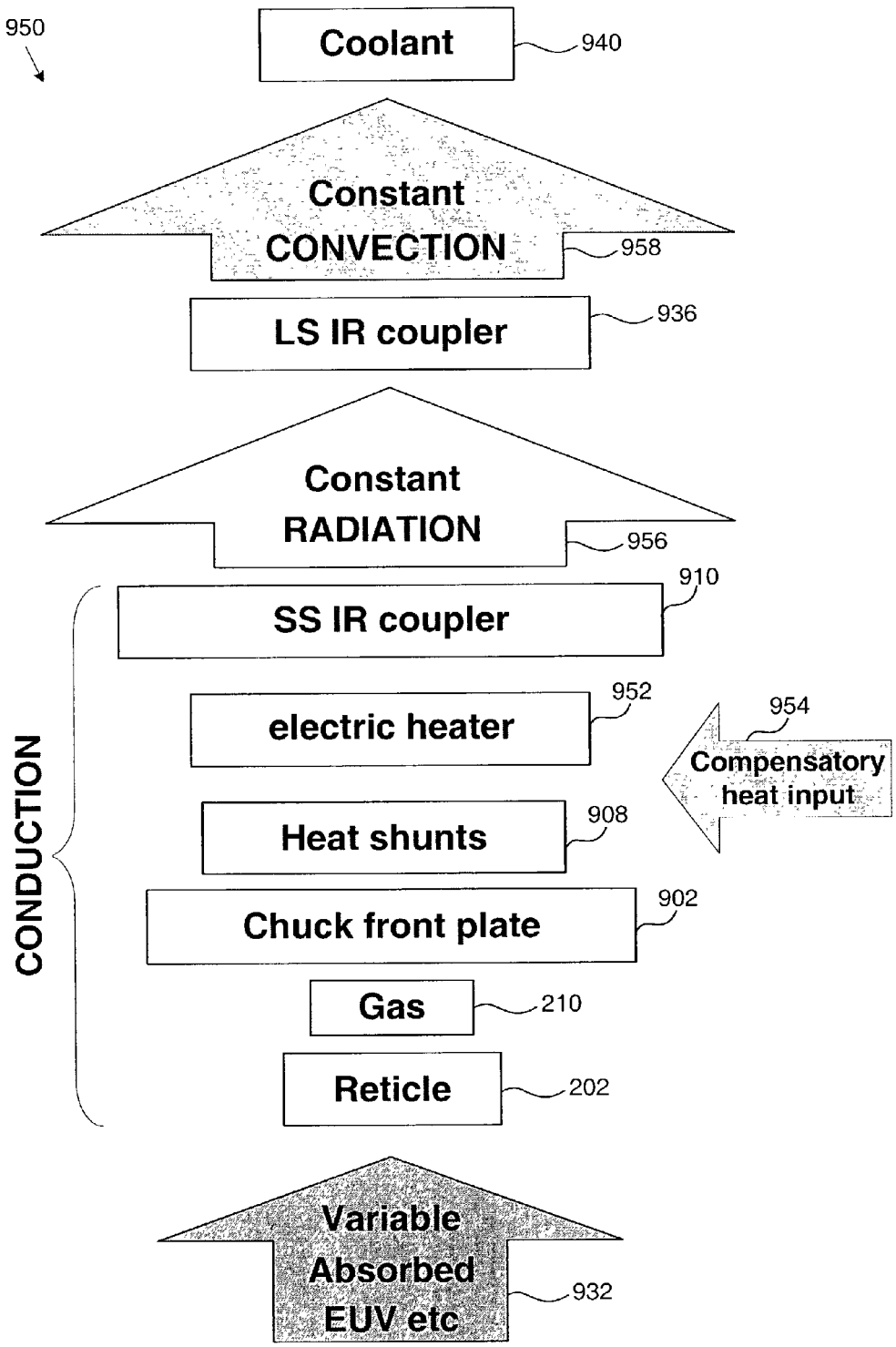

FIGS. 9C and 9D are heat flow diagrams of heat generated from light absorption in a reticle through the reticles and a portion of a lithographic system of FIG. 9A.

Figure 10A:
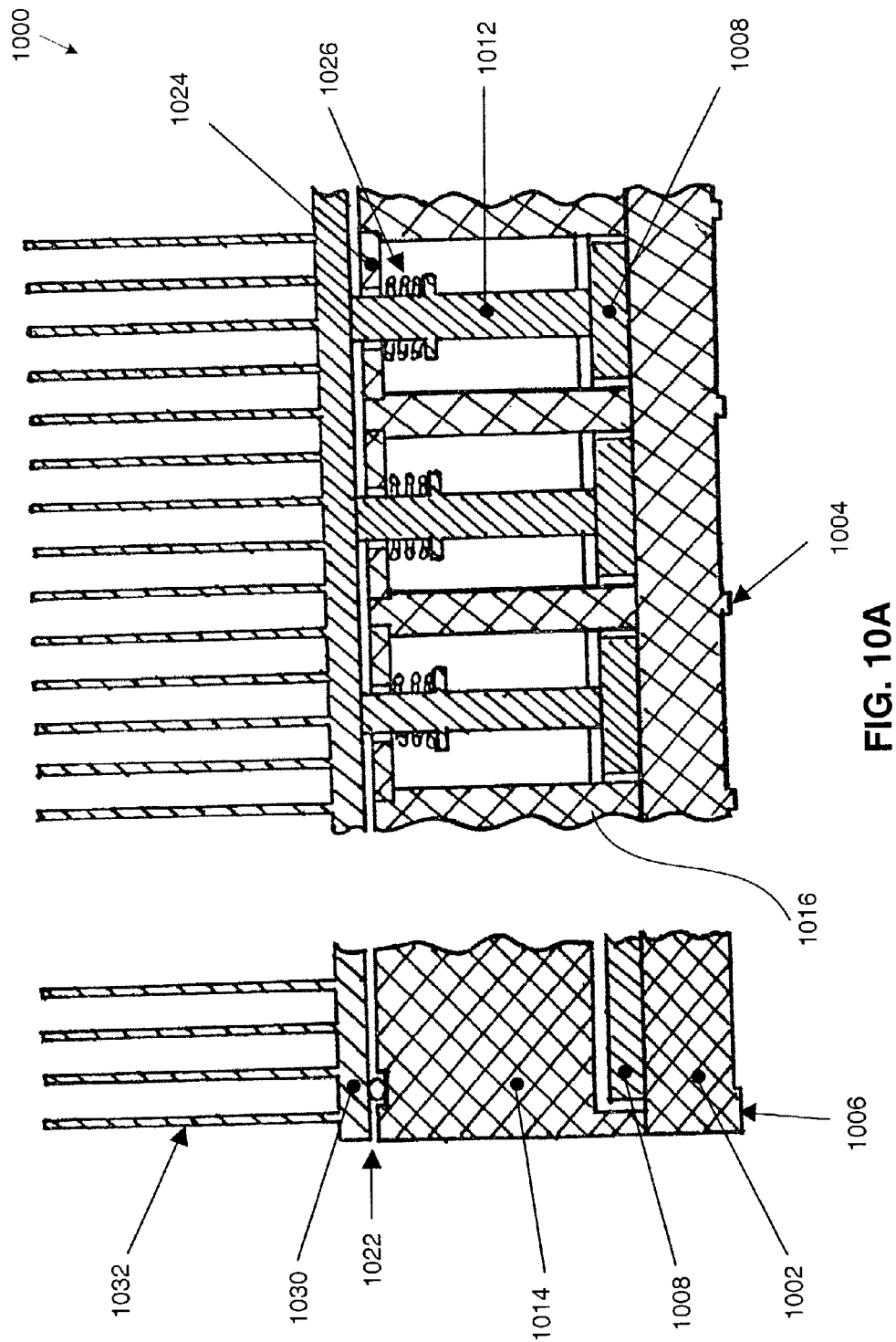

FIG. 10A is a cross section view of portions of a reticle holding system according to embodiments of the present invention.

Figure 10B:
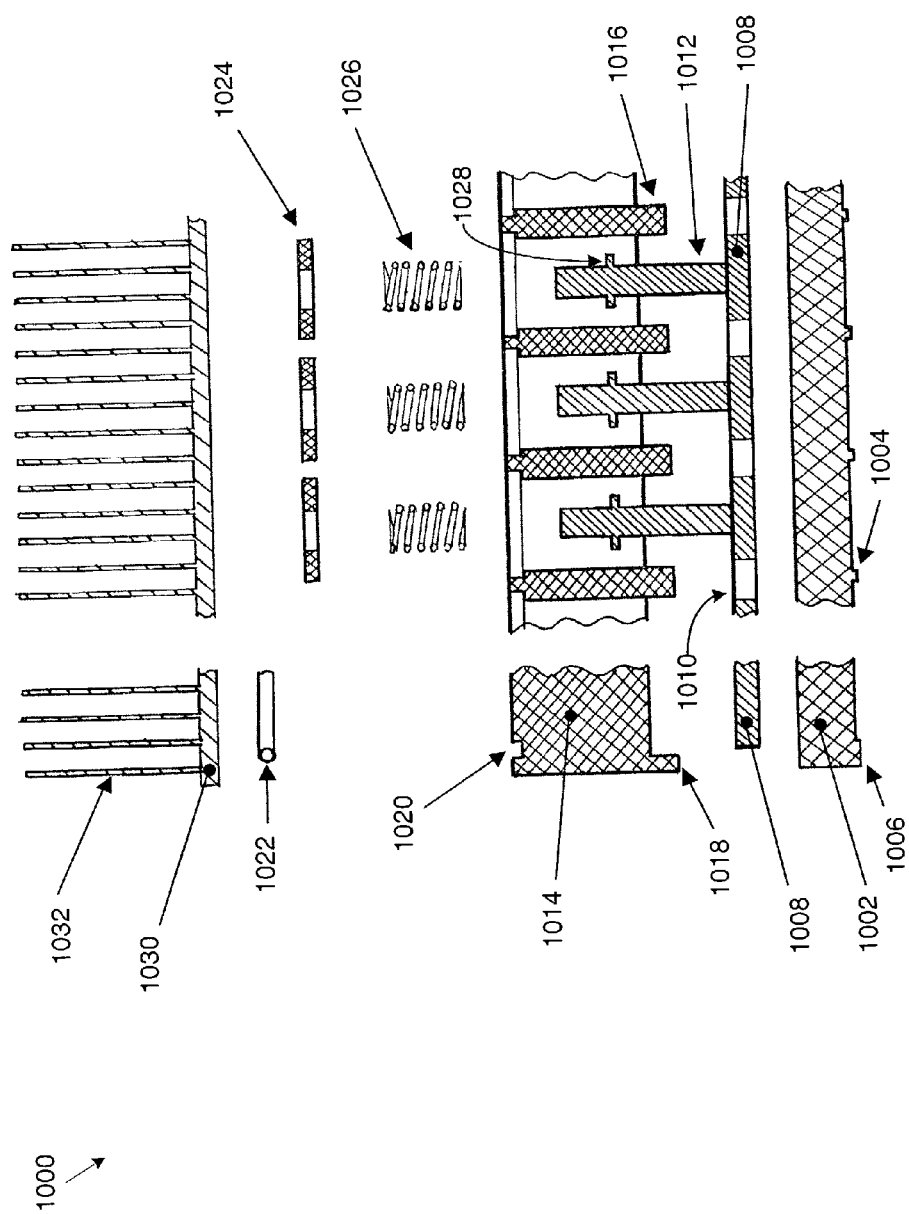

FIG. 10B is a cross sectional exploded view of portions of a reticle holding system according to embodiments of the present invention.

Figures 10C, 10D:
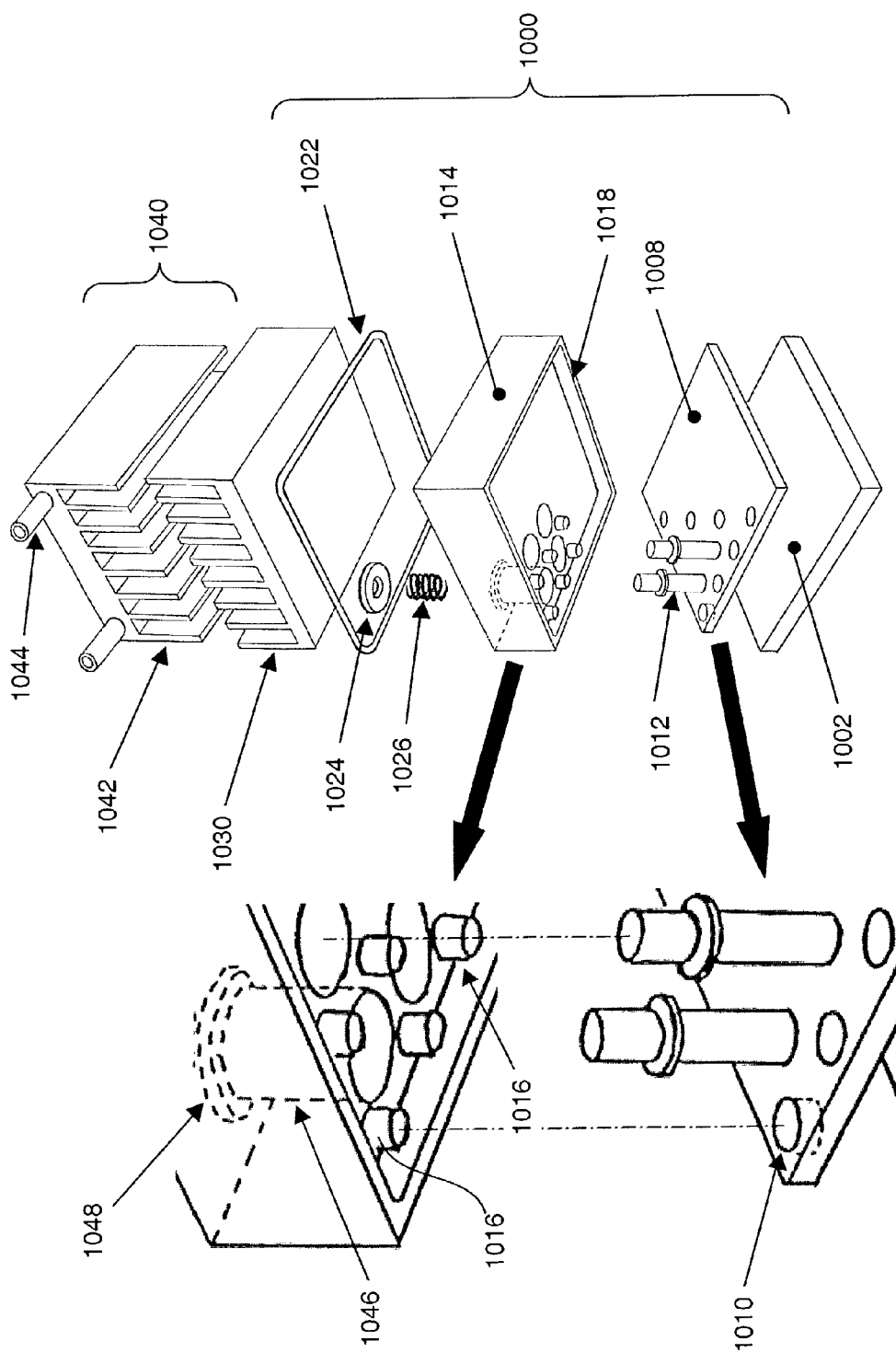

FIG. 10C is an exploded perspective view of portions of a reticle holding system according to embodiments of the present invention.

FIG. 10D is a zoomed in view of a portion of FIG. 10C.

FIGS. 10E, 10F, 10G, and 10H are a cross sectional exploded views of portions of a reticle holding system according to embodiments of the present invention.

Figure 10E:
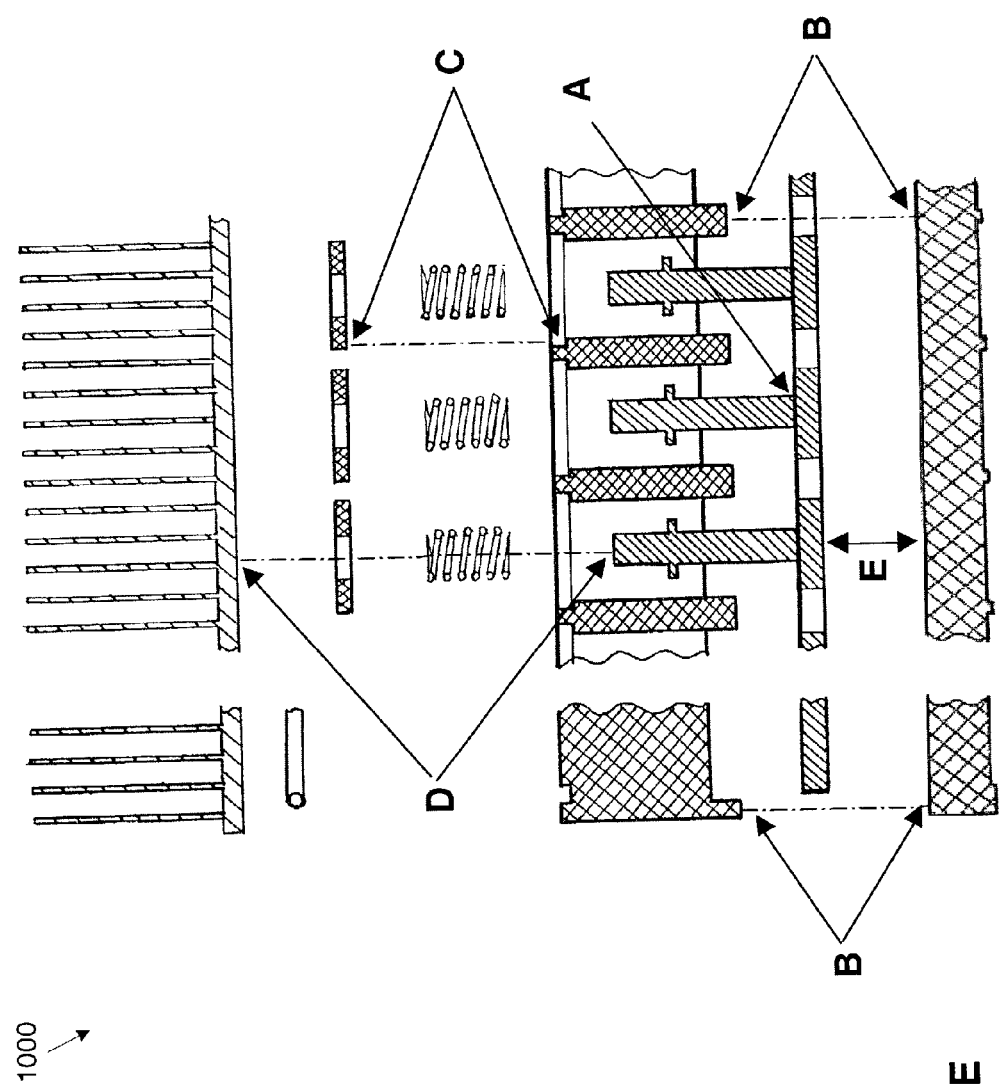
Figure 10F:
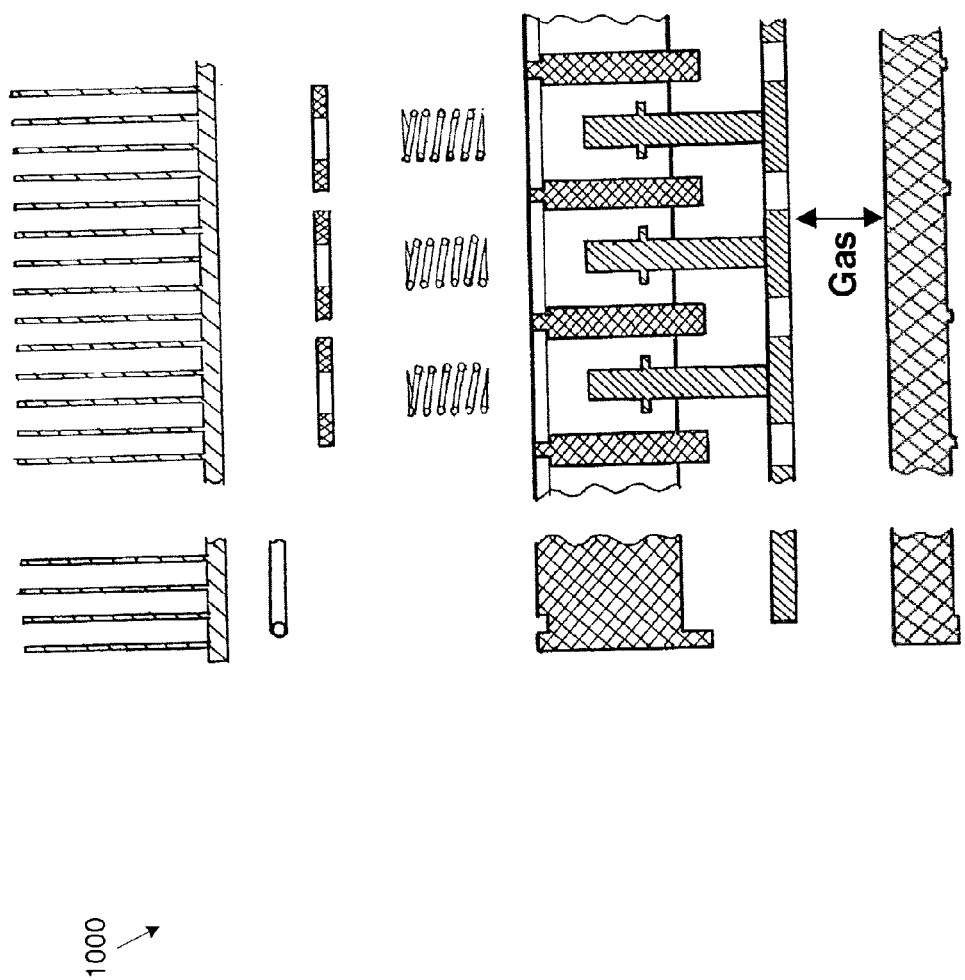
Figure 10G:
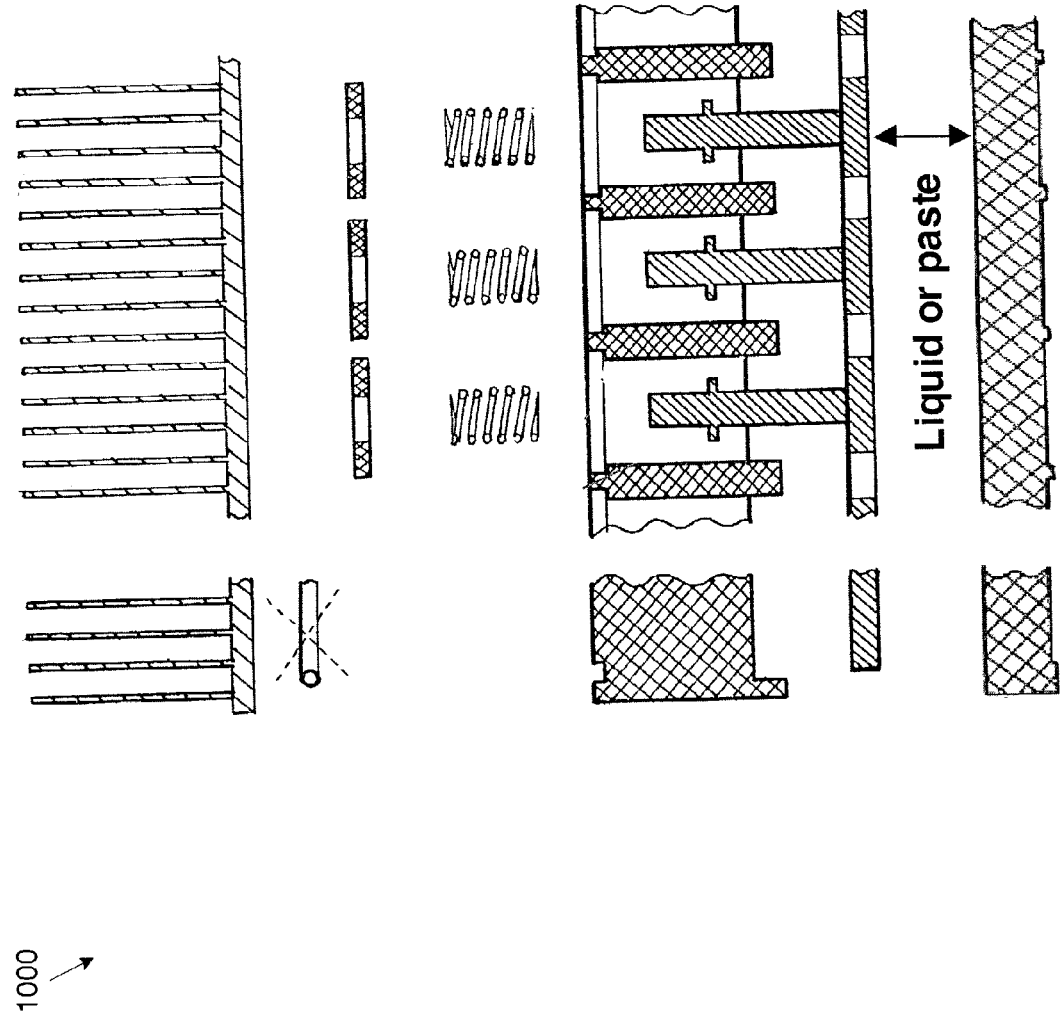
Figure 10H:
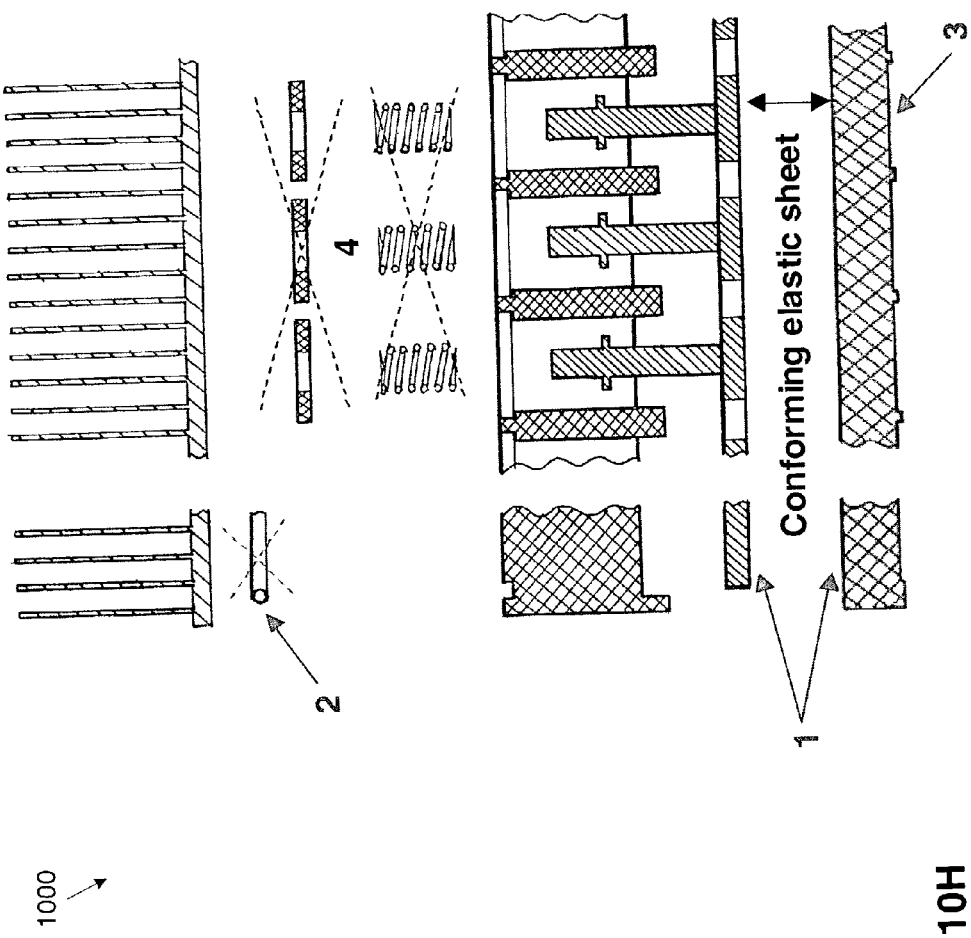
Figure 10I:
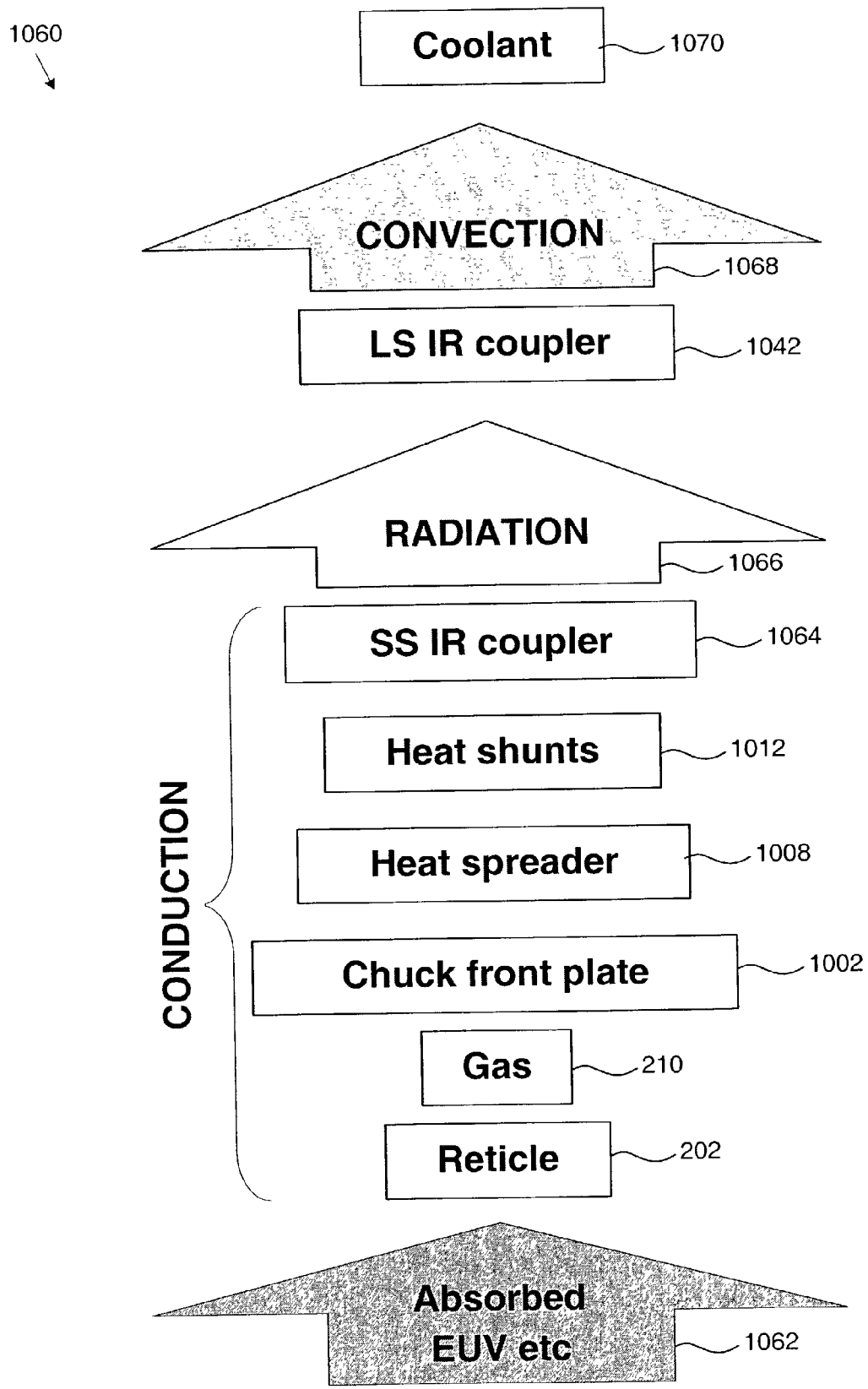
Figure 10J:
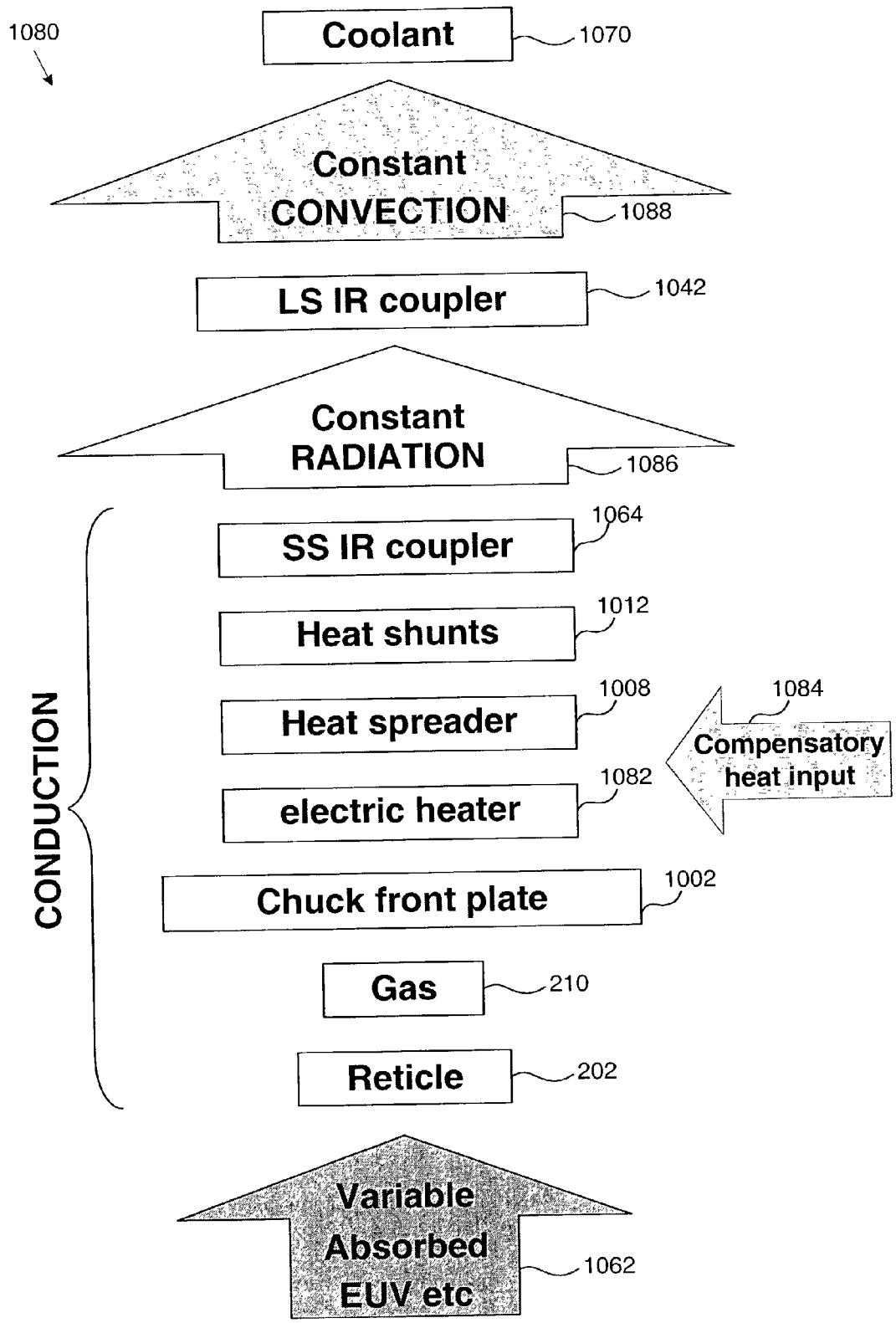

FIGS. 10I and 10J are heat flow diagrams of heat generated from light absorption in a reticle through the reticles and a portion of a lithographic system of one or more of FIGS. 10A–10H.

Figure 11A:
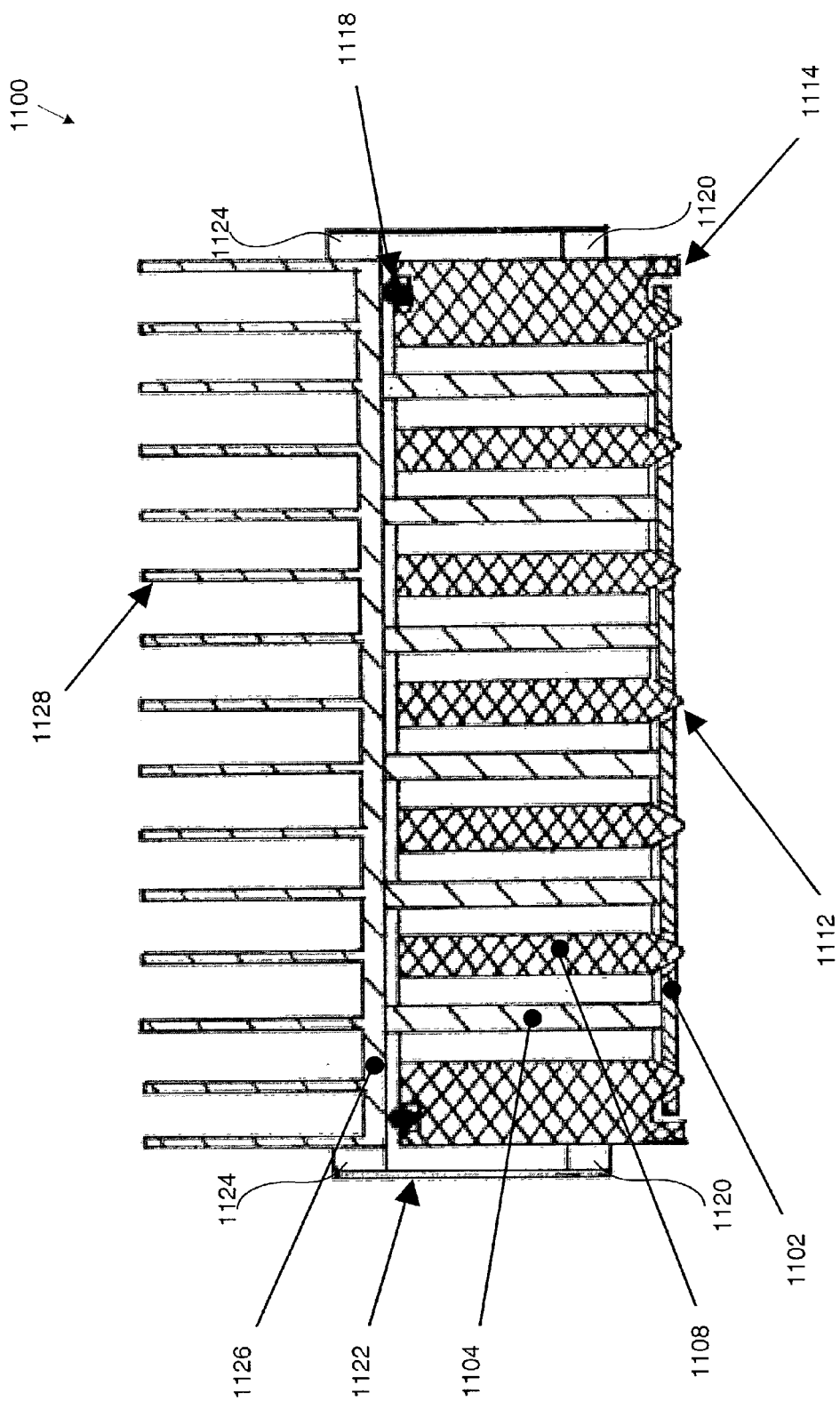

FIG. 11A is a cross section view of portions of a reticle holding system according to embodiments of the present invention.

FIG. 11B is a cross sectional exploded view of portions of a reticle holding system according to embodiments of the present invention.

Figure 11C:
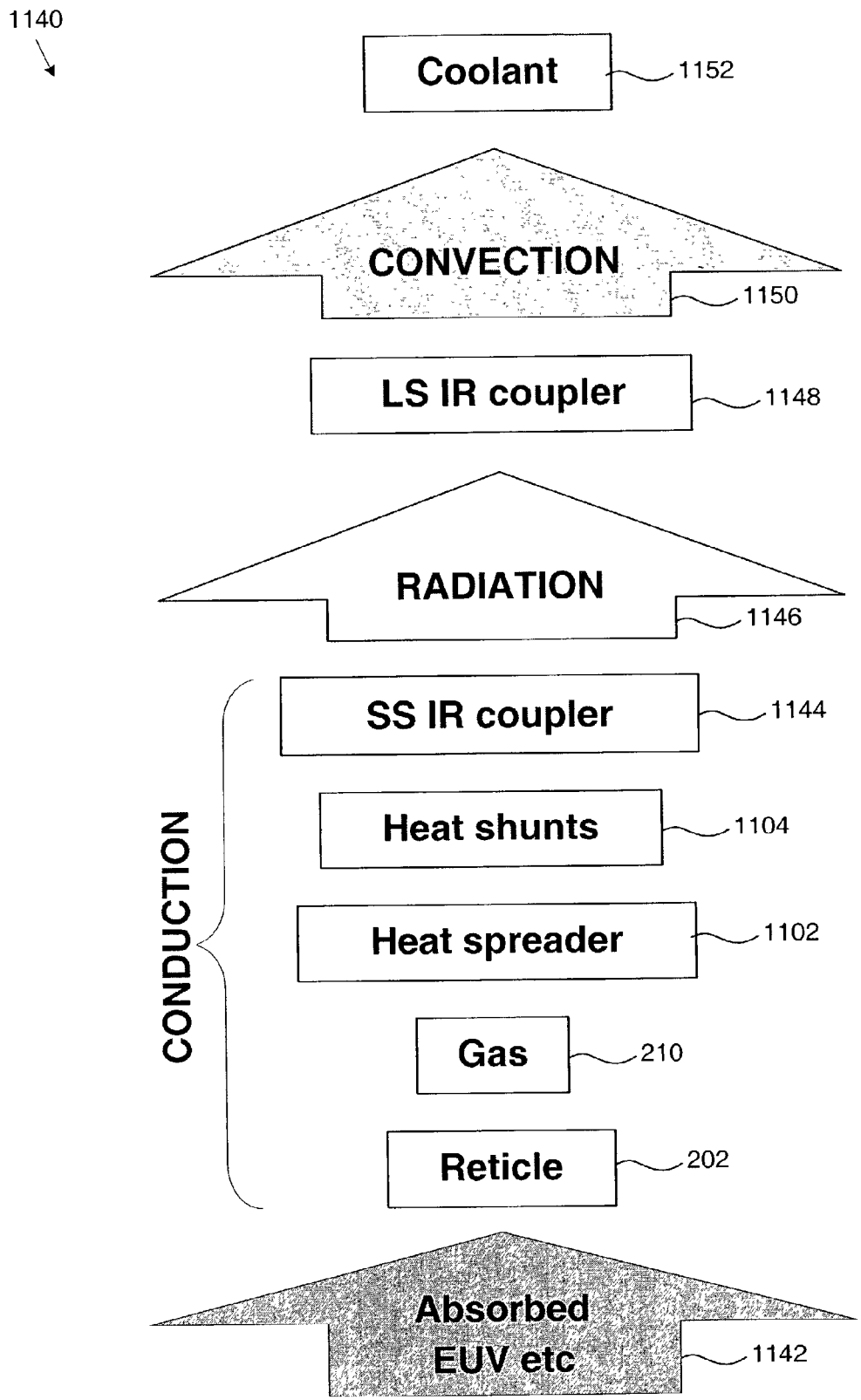

FIG. 11C is a heat flow diagram of heat generated from light absorption in a reticle through the reticles and a portion of a lithographic system of one or more of FIGS. 11A and 11B.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

Throughout the specification, a reticle is described as the element being cooled by the systems and methods according to the embodiments of the present invention. It is to be appreciated that the systems and methods can function to cool a wafer held to a short stroke wafer stage while the wafer is being exposed. This is done in the same way the systems and methods cool the reticle held to a short stroke reticle stage being used for exposure. Thus, throughout the specification the term reticle can be interchanged with the terms wafer or substrate without departing from the invention. Merely for convenience, most of the description of the systems and methods of the present invention will refer to a reticle.

Systems and methods of the various embodiments make it unnecessary to circulate a coolant within a short stroke stage. This eliminates vibrations produced by coolant fluid flow through the short stroke stage. Vibrations are detrimental to lithographic performance of a lithographic tool during overlay of patterns on a wafer. In addition, the systems and methods of the embodiments prevent changes in thermally-induced distortion of the short stroke stage by maintaining the temperature and temperature distribution within the short stroke stage constant regardless of actinic heat load incident on a reticle, a wafer, or a substrate. Thus, embodiments of the present invention result in improved lithographic performance due to more accurate position control of the short stroke stage, while removing a fairly large actinic thermal load from the reticle. This is done by: (1) conducting heat through the reticle, wafer, or substrate and short stroke stage components, (2) radiatively transferring heat from the short stroke stage to a long stroke stage, and (3) using convection and a cooling system to dissipate heat from the long stroke stage. The short stroke stage can be magnetically levitated from the long stroke stage. This way there is no physical contact, but the long stroke stage's movements can still control the short stroke stage's movements. By not physically contacting the long stroke stage, the short stroke stage is not affected by vibrations in the long stroke stage caused by the flowing coolant.

Throughout the specification, it is to be appreciated any use of "above," "below," "forward," "backward," or any other directional language is only in reference to the figure(s) being described, and not a limitation as to positioning of any aspects of the system.

Throughout the specification, as best seen in FIG. 6B and 10C, short stroke stage (or SS) refers to a stage that does fine positioning of a wafer or reticle during exposure. The SS levitates with respect to, and is "controlled" by, a long stroke stage (or LS), also best seen in FIGS. 6B and 10C. The LS performs most of the cooling after heat is transferred to it through various devices associated with the various embodiments of the present invention. The LS is also responsible for coarsely positioning the wafer or reticle during exposure.

A. Overall System and Method

Figure 1:
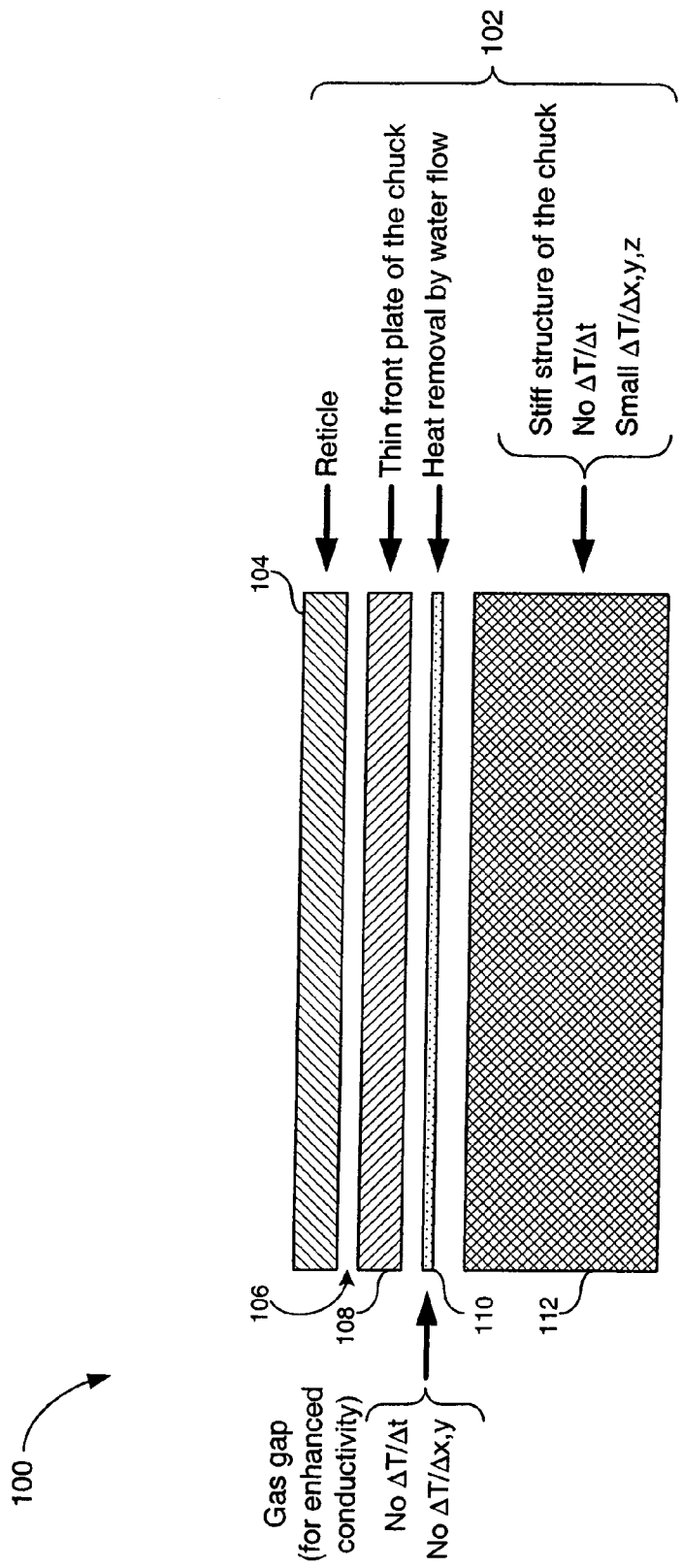
FIG. 1 shows a conventional reticle holding system.
Figure 2:
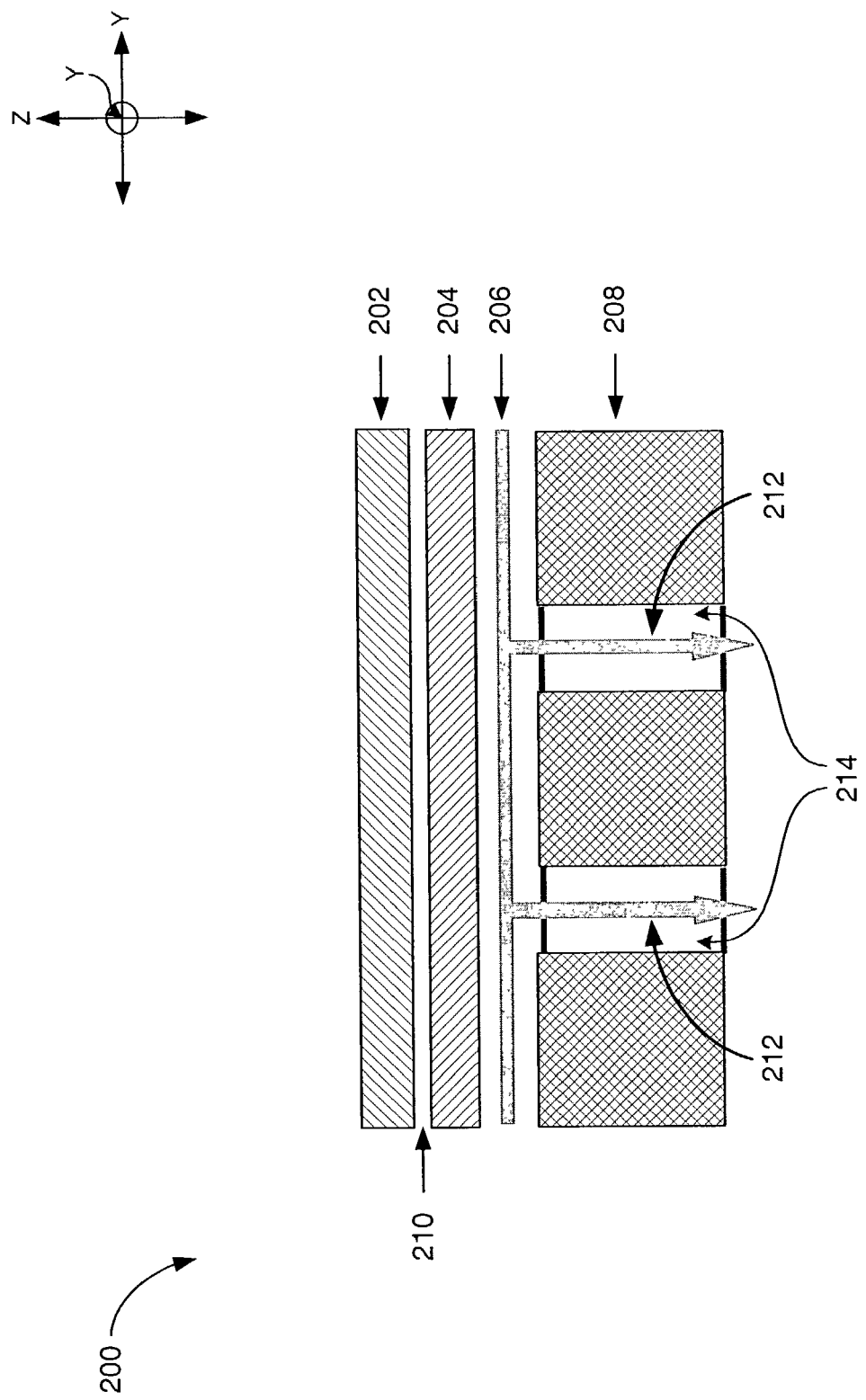
FIG. 2 shows a reticle holding system according to embodiments of the present invention.

FIG. 2 shows a portion 200 of a lithographic system according to embodiments of the present invention. Portion 200 includes a substrate (e.g., a reticle or a wafer) 202, a substrate holding (or constraining) device or portion (e.g., a chuck, an electrostatic chuck, a rigid structure, or the like) 204, a uniform heat removing device or portion (e.g., a heat spreader or a heat spreading plate) 206, and a radiative coupling device or portion (e.g., a radiative coupler) 208. In some embodiments, there is a thermal coupling means (e.g., a gap filled with a fluid) 210 between substrate 202 and chuck 204. In some embodiments, heat spreader 206 can have an extension (e.g., a heat shunt or a shunt) 212 positioned in an opening 214 (e.g., an elongated opening) formed through short stroke structure (not shown in this figure). Thus, most heat generated by absorption of light that reflects from reticle 202 is uniformly spread by heat spreader 206 and passed to shunt 212 in elongated openings 214 to be radiatively transferred by radiative coupler 208 to long stroke stage (not shown in this figure), without entering short stroke structure.

In various embodiments described throughout the specification, a substrate holding device can have substantially zero coefficient of thermal expansion (CTE) and a heat removing device can have a much larger CTE and more thermal conductivity than the substrate holding device.

In various embodiments throughout the specification, substrate holding device 204 can be manufactured from low expansion glass or ceramic, such as CORNING's Ultra Low Expansion Glass, SCHOTT's Zerodur, or KYOCERA's Cordurite Low Expansion Ceramic. In various embodiments throughout the specification, heat removing device 206 can be made from aluminum nitride, silicon carbide, aluminum, copper, silver, or materials with similar properties.

In various embodiments throughout the specification, thermal coupling means 210 can be a fluid, such as a gas, that can be pressurized to a pressure higher than ambient pressure of gasses surrounding the lithographic system.

Figure 3:
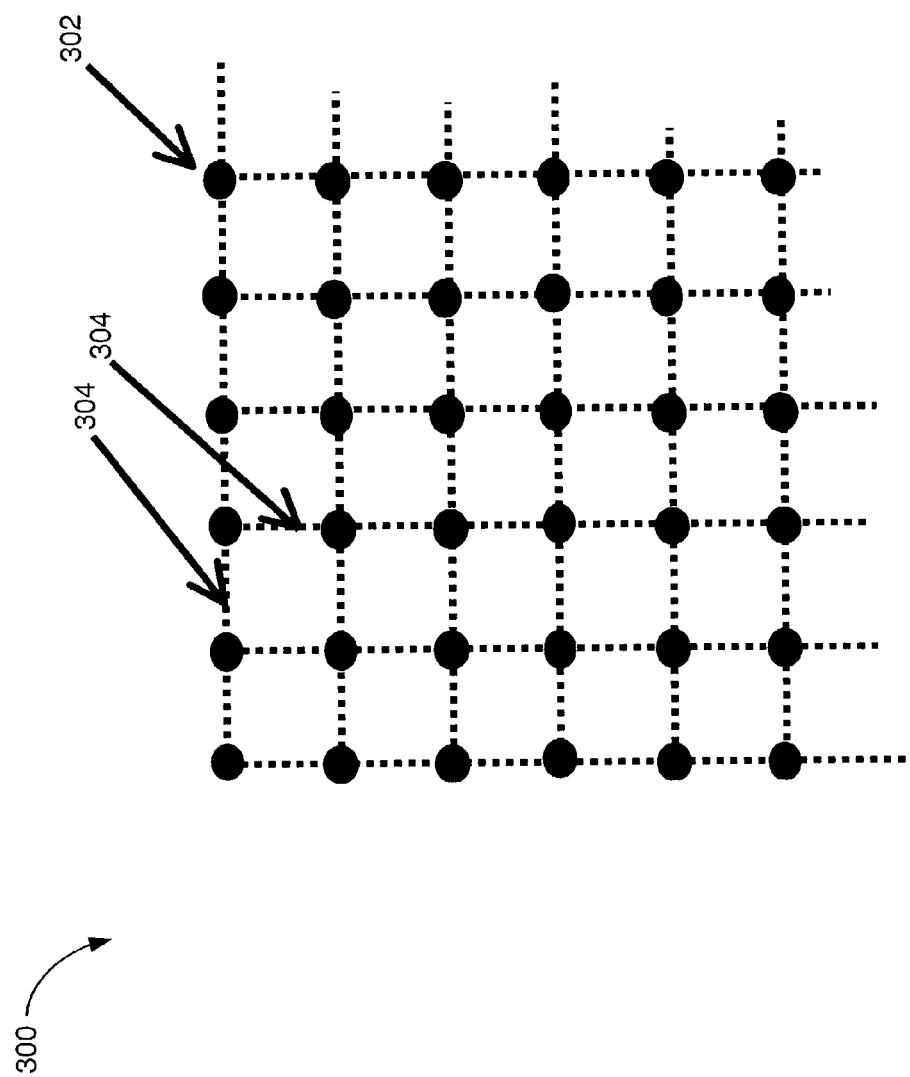
FIGS. 3 and 4 show grid patterns for protrusions (e.g., burls) from a reticle holding system that contact reticles according to embodiments of the present invention.
Figure 4:
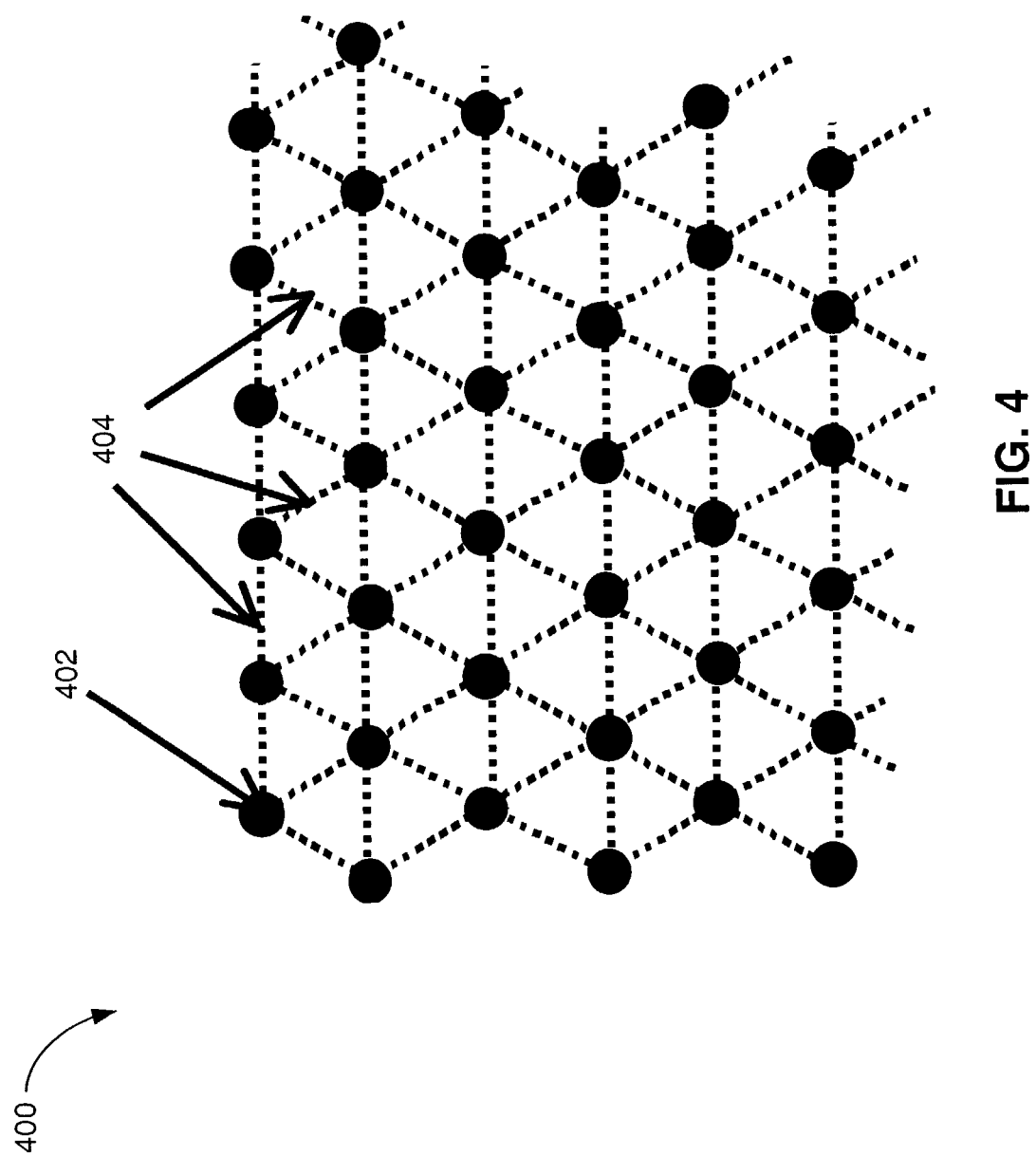

FIGS. 3 and 4 show portions 300 and 400, respectively, of chuck 204 according to embodiments of the present invention. During use, reticle 202 can be held electrostatically on chuck 204, while resting on protrusions (e.g., pins, pimples, burls, etc.) 302 or 402 located at an intersection of support devices (e.g., ribs) 304 or 404 in the short stroke structure. Burls 302 can be "stubby cylinders" approximately 5 μm tall by 1 mm in diameter. Burls 302 are used to make reticle flatness less sensitive to particles entrapped between reticle 202 and chuck 204. Recessed areas between burls 302 form gaps between reticle 202 and chuck 204, which can accommodate the presence of relative large particles, for example particles up to 5 μm in size. A difference between portion 300 in FIG. 3 and portion 400 in FIG. 4 is the grid design, where portion 300 has ribs 304 forming a square grid design and portion 400 has ribs 404 forming a triangular grid design.

A pitch of burls 302 is determined based on a desired maximum in-plane distortion. Pitch refers to the distance between adjacent burls 302 or 402. For scanning lithographic systems, reticle 202 is accelerated in a Y direction (e.g., perpendicular to the page in FIG. 2) up to 6 G's to achieve high throughput. Reticle 202 is electrostatically clamped to chuck 204 with force in Z direction (e.g., vertical with respect to the page in FIG. 2). Friction can provide force in the Y direction to hold reticle 202, but because a high friction is needed a high clamping force is needed (e.g., approximately 10 Kpascal clamping pressure). This high clamping pressure causes reticle 202 to sag and distort between burls 302 because there is no support there. This sag may cause reticle 202, and therefore the pattern on reticle 202, to exceed allowable distortion limits. Thus, these conditions dictate positioning of burls 302. In some embodiments, burls 302 can be spaced 8.5 mm apart for a square grid of FIG. 3 or 12.5 mm apart for a triangular grid of FIG. 4.

When reticle 202 is unconstrained (i.e., heated up, but not clamped), the thermal expansion of reticle 202 would exceed most design specifications by three or more times the tolerance allowed. Ideally, reticle 202 would be clamped with infinite friction to a perfectly rigid chuck 204 that does not expand, then the thermal expansion and distortion would be approximately a quarter of the tolerance allowed. Unfortunately, ideal situations are only theoretical. Therefore, the following discussion describes several embodiments that include a chuck 204 with low thermal expansion and that is rigid, which try to model as close as possible the ideal situation.

Figure 5:
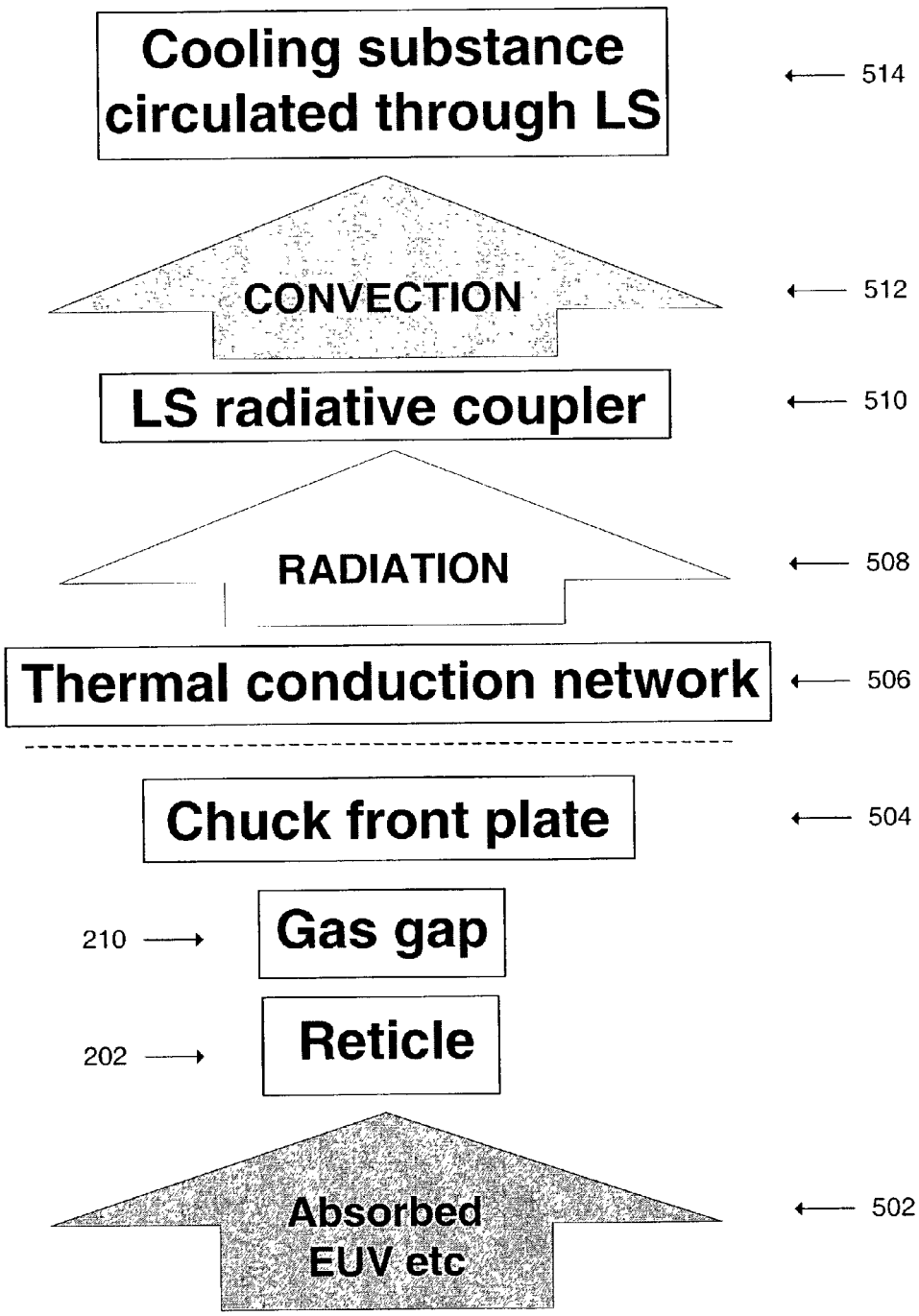
FIG. 5 is a heat flow diagram of heat generated from light absorption in a reticle through the reticles and a portion of a lithographic system according to embodiments of the present invention.

FIG. 5 shows heat flow 500 through portions of a lithographic system according to embodiments of the present invention. Throughout the rest of the specification, discussions will use EUV light as the environment of the lithographic system. The term EUV light refers to radiation having a wavelength at or below 157 nanometers (nm), including but not limited to radiation between 70–100 nm. It is to be appreciated, the systems and methods of the various embodiments can be used to dissipate heat generated by any type of light source in a lithography system (including light having a wavelength greater than 157 nm).

EUV light reflected from reticle 202 causes heat to be absorbed by reticle 202, as shown at 502. Heat is transferred from reticle 202 through gas gap 210 to a chuck front plate 504, which can be part of chuck 204, and though a thermal conduction network 506. Thermal conduction network 506 can be any known device or structure that transfers heat away from chuck front plate 504, such as extensions (e.g., element 610 in FIG. 6A and element 650 in FIG. 6B), or the like. Thermal conduction network 506 is usually part of or coupled to heat spreader 206. After passing through thermal conduction network 506 the heat is radiatively transferred at 508 to a radiative coupler 510 (discussed in more detail below) coupled to a long stroke stage (LS) (not shown, but shown and discussed in more detail below). Radiative coupler 510 transfers the heat through the long stroke stage using convection at 512. The transferred heat is cooled via a circulating cooling substance (e.g., coolant) at 514, which circulates through the long stroke stage.

In practice, radiative heat transfer rates are generally low, so to compensate for this radiative surface area can be increased. The surface area needed to remove the heat from chuck 204 that is generated by reticle 202 during EUV light exposure via radiative coupler 208 is based on a "folding factor" of radiative coupler 208. The folding factor is defined as:

$$\text{Folding Factor} = \frac{\text{Radiative area required in coupling device}}{\text{Footprint area of reticle}}$$

In most embodiments, a range for the folding factor required is approximately 12 to 17. The heat load determines the folding factor. Using a folding factor of this magnitude reduces the need to have very cold liquids running through the system to cool the long stroke stage radiative coupler 510.

Several types of radiative couplers 510 can be used. A first type of radiative coupler 510 is an interleaved flat fin coupler system, which is sensitive to a gap increases between couplers 208 and 510 only in the X direction and very insensitive to relative motion in the Y and Z directions (i.e. in the directions parallel to the depth and length of a flat fin, e.g., element 610 in FIG. 6A). Therefore, the interleaved flat fin coupler system easily produces large radiative surface areas even with fairly large gaps (e.g., gaps greater than 1 mm). Another type of radiative coupler 510 is a pin fin-in-hole coupler system, which is equally and highly sensitive to gap increases between couplers 208 and 510 in both the X and Y directions. It is harder to produce large surface areas with the large gaps required to accommodate the relative motion between the long stroke and short stroke stages with the pin fit-in-hole radiative coupler system. However, the pin fit-in-hold radiative coupler 510 can be made more compact, lightweight, and may be easier to manufacture as compared to the interleaved flat fin coupler system. Various embodiments discussed below use one or the other of these types of couplers 510. In practice, which embodiment to choose for a specific application depends mostly on heat load, allowable thermally induced distortion, and allowable lower limit for coolant temperature. The embodiments below are listed in order of increasing thermally induced distortion suppression performance, heat load capability, and efficiency, which in general coincide with increasing complexity, weight, and cost.

B. Reticle Holding System Using Honeycomb Ribs to Conduct Heat Through Discrete Short Stroke Stage Coupler FIG. 6A shows a cross sectional view of portion 600 of a short stroke stage (SS) and a long stroke stage (LS) in a lithography tool according to embodiments of the present invention. Portion 600 includes a front plate 602 coupled to burls 604 and ribs 606. In some embodiments, ribs 606 can be formed in a honeycomb structure. Portion 600 also includes a short stroke stage radiative coupler's flat fins 610.

FIG. 6B shows a side view of portion 620 that includes portion 600 according to embodiments of the present invention. A backside 622 of reticle 202 is temporarily attached to a front side 624 of a short stroke stage 626. Reticle 202 can be temporarily coupled by using an electrostatic clamp (not shown) built into short stroke stage 626. A gas can be introduced at low pressure between reticle 202 and the electrostatic clamp in order to improve thermal conductivity of the physical interface between them. One example of the gas can be argon. In some embodiments, heat is added to short stroke stage 626 at a rate that varies opposite to an actinic heat load. This is done so that the total heat load, defined as the sum of the actinic heat load plus the added heat load, is always substantially equal for every reticle 202 and illumination condition. The total heat load is conducted through a thickness of short stroke stage 626 and transferred from a backside 628 of short stroke stage 626 to a long stroke stage 630 using a radiative coupling system 632. Removing the total heat load transferred through long stroke stage 630 by convection at 633 (FIG. 6D) is done by circulating a coolant fluid 634 through passages (e.g., ducts, tubes, channels, or the like) 636 in long stroke stage 630.

As will be discussed below for several embodiments of the present invention, it may be necessary to provide heat to certain portions of a lithography system. In operation steady state is never reached, and it is important to control the behavior of a chuck/reticle portion of a system. This will allow for minimization of distortion during transients. To do this, the temperature or the chuck/reticle portion is maintained at a constant heat load or temperature by adding electric heat inversely proportional to the absorbed actinic heat. This allows for fast warm up to operating temperature, which is very desirable and also prevents excessive temperature drop of the short stroke when there is no actinic heat load (for example, while reticles are being exchanged).

In embodiments that include the added heat, a heating device (e.g., an electric heater) 638 coupled to short stroke stage 626 can produce the heat. In some embodiments, electric heater 638 can be a film heater, substantially of the same dimensions as a footprint of reticle 202, that is located near front surface 624 of short stroke stage 626 in close proximity to backside 622 of reticle 202. In some embodiments, electrical input to heater 638 can be controlled by a controller 640 coupled to a sensor 642. The controller 640 can use feed forward methods, which include: (1) measuring actinic power incident on reticle 202 using sensor 642 to detect EUV light intensity; (2) measuring or reading from stored data in storage 644 an average absorptivity of reticle 202; (3) calculating the actinic heat load by multiplying the actinic power times the average absorptivity; and (4) adjusting the heater current based on the calculated actinic heat load. In other embodiments, electrical input to heater 638 can be controlled by controller 640 using feedback methods, which includes using at least one temperature sensor 642 mounted on the short stroke stage 626. In still other embodiments, controller 640 can be a HEATERSTAT-type controller 640, made by Minco Products, Inc, that is described in "Bulletin CT198", copyrighted Minco May 2000, which is incorporated herein by reference in its entirety. The electrical input to heater 638 can be controlled by HEATERSTAT-type controller 640 and heater 638 (e.g., a foil heater) can be used for both heating and temperature sensing. In still further embodiments, controller 640 using a combination of feed forward and feedback methods can control the electrical input to heater 638. In still further embodiments, no heat is added to short stroke stage 626, so the temperature of short stroke stage 626 is allowed to vary with the actinic heat input.

With continuing reference to FIG. 6B, radiative coupler 632 includes a first finned plate 646 having a base plate 648 and a plurality of fins 650 perpendicularly disposed on base plate 648. Finned plate 646 is coupled to backside 628 of short stroke stage 626. Radiative coupler 632 also includes a second finned plate 652 having substantially the same geometry as first finned plate 646, which is coupled to a front side 654 of long stroke stage 630. The configuration of structure 620 maintains long stroke stage 630 aligned to short stroke stage 626 in such a way that fins from first and second finned plates 646 and 652, respectively, are interleaved without touching each other.

FIG. 6C shows finned plate 646 and/or 652 according to embodiments of the present invention. Finned plates 646/652 each include a thermal relief section 662, heat spreader section 664, and fin section 665. In one example, thermal relief section 662 has pins 668. Thermal relief section 662 can be coupled to SS structure 626 or LS structure 630. Thermal relief section 662 helps reduce thermal strain due to material mismatch. For example, thermal relief section 662 allows a low coefficient of thermal expansion (CTE) short stroke structure 626 to be attached to a higher CTE coupler 646 flexibly enough to avoid excessive thermal strain due to the material mismatch, a heat spreader section 664, and fin section 665. A tip 668 of each pin 662 can be coupled to a respective stage 626 and/or 630, which can be accomplished using thermal epoxy. In some embodiments, finned plate 646 and/or 652 can be coupled to respective stages 626 and/or 630 with a compliant material, for example with a soft polymer. In other embodiments, finned plates 646 and/or 652 can be attached to respective stages 626 and/or 630 via deformable soft-solder columns. In some embodiments, finned plates 646 and/or 652 can be made of aluminum and coated with a material having high infrared emissivity. In other embodiments, finned plate 646 and/or 652 can be made of carbon. In some embodiments, a footprint of both finned plates 646 and 652 can be approximately the same (e.g., about 200 mm×200 mm). The dimensions of fins 665 can be about 200 mm in length×25 mm in height×1 mm in thickness. A gap between adjacent interleaved fins 665 can be 0.1 mm to 2 mm. To maintain alignment between stages 626 and 630, motors, bearings, and a position sensor that are used for general stage positioning and guidance can be used. Therefore, no additional or special alignment devices specific to structure 620 need to be added.

FIG. 6D shows heat flow 670 through a system including portions 600 and 620 according to embodiments of the present invention. EUV light causes heat to be absorbed at 672 by reticle 202. The heat is transferred by conduction through reticle 202, gas 210, chuck front plate 602, chuck honeycomb 606, interface 674, which includes pins 662, and fined plate 646 (e.g., SS IR coupler). Next, through radiation at 676 heat is transferred from fined plate 646 to long stroke stage (LS) radiative coupler (e.g., IR coupler) 652. Finally, through convection at 633, heat is removed from the long stroke stage 652 by coolant 634.

C. Reticle Holding System Using Honeycomb Ribs to Directly Radiate Heat to Long Stroke Stage Coupler FIG. 7A shows a cross sectional view of a portion 700 of a short stroke stage (bottom, crosshatched portion) and long stroke stage (top, non-crosshatched portion) in a lithography tool according to embodiments of the present invention. Portion 700 can be a radiative coupler or a pin fin-in-hole radiative coupler. Portion 700 includes a front plate 702 having protrusions (e.g., burls) 704 and extensions (e.g., ribs) 706. In some embodiments, ribs 706 can be formed in a honeycomb-type configuration. Portion 700 also includes a long stroke stage radiative coupler 708 having extensions 710 (e.g., long stroke stage (LS) pin fins) and passages (i.e. ducts, tubes, or channels) 712. A cooling substance (e.g., coolant) 714 flows through passages 712. Pin fins 710 can be positioned in square shaped holes 716 that are formed between ribs 706.

FIG. 7B shows heat flow 720 through a system including portion 700 according to embodiments of the present invention. EUV light causes heat to be absorbed at 722 by reticle 202. The heat is transferred by conduction through reticle 202, gas 210, chuck front plate 702, and ribs 706 (e.g., chuck honeycomb). Next, through radiation at 724 heat is transferred from ribs 706 to long stroke stage (LS) radiative coupler (e.g., IR coupler) 708. Finally, through convection at 726, heat is removed from the long stroke stage by coolant 714.

Some drawbacks for the embodiments shown in FIGS. 7A and 7B are that fin efficiency is low due to poor conductivity of honeycomb ribs 706 In general, materials found to have low CTE, which are suitable for fabricating a thermally stable structure such as the short stroke stage, are also found to have very low thermal conductivity. Having low thermal conductivity results in low efficiency when used to transfer heat, such as is the case with radiative fins. The low fin efficiency requires high folding factors to achieve sufficient radiative area, which results in a heavy construction. Further, there is a high sensitivity to a gap 716 (FIG. 7A) between the short stroke stage and the long stroke stage because of the use of pin fins 710. Thus, due to poor overall efficiency, these embodiments may require very cold coolant temperatures to dissipate a possible maximum 12 W of power absorbed by reticle 202 based on EUV light reflecting from reticle 202. In addition, because the heat travels through the short stroke stage, a temperature gradient (i.e. higher temperature near the reticle and lower temperature near the coupler) is developed, which causes unequal distortion, bowing, and warping. Therefore, the thermally induced distortion of the reticle may exceed acceptable limits due to the distortion of the reticle holding device.

D. Reticle Holding System Using Hollow Heat Shunts to Directly Radiate Heat to Long Stroke Stage Coupler FIG. 8A is a cross sectional view of a portion 800 of a short stroke stage and a long stroke stage in a lithography tool according to embodiments of the present invention. Portion 800 includes a front plate 802 having protrusions (e.g., burls) 804 and extensions (e.g., ribs) 806. In some embodiment, ribs 806 can be in a honeycomb configuration. Portion 800 also includes heat shunts 808 coupled to a heat spreader plate 810 coupled to front plate 802. Portion 800 further includes a long stroke stage (LS) coupler (e.g., an IR coupler) 812 having extensions (e.g., LS IR-coupler pin fins) 814 and passages 816 having a cooling substance 818 flowing through them.

FIG. 8B shows heat flow 830 though a system including portion 800 according to embodiments of the present invention. EUV light causes heat to be absorbed at 832 by reticle 202. The heat is transferred by conduction through reticle 202, gas 210, chuck front plate 802, heat spreader 810 and heat shunts 808. Next, through radiation at 834 heat is transferred from shunts 808 to long stroke stage (LS) radiative coupler (e.g., IR coupler) 812. Finally, through convection at 836, heat is removed from the long stroke stage by coolant 818, as is described above.

Portion 800 is quite compact and light compared to other embodiments described above and below, but good thermal performance may be difficult to achieve. Heat spreader 810 provides excellent contact between shunts 808 and front plate 802, and also enhances thermal stability of front plate 802. This configuration results in a very high sensitivity to a gap 820 (FIG. 8A) between the short stroke stage and the long stroke stage because of the double use of pin fins. For working gaps of less than 1.5 mm, 12 W of power absorbed by reticle 202 based on reflected EUV light can require fairly cold coolant temperature.

This embodiment improves on the embodiment shown in FIGS. 7A–7B by replacing the conductive ribs with even more efficient shunts for heat conduction across the thickness of the short stroke. This embodiment also diverts most of the heat flow away from the honeycomb, which greatly reduces its temperature gradient and consequently its thermally induced distortion.

E. Reticle Holding System Using Heat Shunts that are Independently Attached to a Front Plate FIG. 9A is a cross section view of a portion 900 of a short stroke stage in a lithography tool according to embodiments of the present invention.

Portion 900 includes a front plate 902 having protrusions (e.g., burls) 904 and extensions (e.g., ribs) 906. In some embodiments, ribs 906 can be in a honeycomb configuration. Portion 900 also includes heat shunts 908 coupled to front plate 902. Portion 900 further includes a short stroke stage (SS) coupler (e.g., an IR coupler) 910 with extensions (e.g., flat fins) 912. These embodiments can also include a long stroke stage with a radiative coupler and a cooling system, as described and shown above and below, but not shown in this figure for convenience.

FIG. 9B shows a configuration 920 for fins 922 that can be used in various embodiments of the present invention. When fins 922 are used at least for the embodiments shown in FIG. 9A and FIGS. 10A–G below, and possibly other embodiments, depending on a required gap between a short stroke stage and a long stroke stage, a resulting resonant frequency (e.g., approximately 1 kHz) for straight, flat fins may be too low. To increase stiffness and resonant frequency (e.g., greater than 3 kHz) fins 922 can be formed in a zigzag design 920 and free ends 924 of fins 922 can be "boxed" by a device 926.

FIG. 9C shows heat flow 930 through a system with portion 900 according to embodiments of the present invention. EUV light causes heat to be absorbed at 932 by reticle 202. The heat is transferred by conduction through reticle 202, gas 210, chuck front plate 902, heat shunts 908, and coupler (e.g., SS IR coupler) 910. Next, through radiation at 934 heat is transferred from coupler 910 to a long stroke stage (LS) radiative coupler (e.g., LS IR coupler) 936. Finally, through convection at 938, heat is removed from the long stroke stage by coolant 940, as is described above.

One shortcoming of portion 900 is that limited contact area between individual shunts 908 and front plate 902 may cause excessive thermal resistance and poor in-plane temperature uniformity (i.e. cold spots where the shunts couple to the front plate). However, this shortcoming can be mitigated by forming concave features on a backside of front plate 902 and matching convex features on an end of shunts 908.

FIG. 9D shows heat flow 950 through a system with a modified portion 900 that has a heating device (e.g., an electric heater) 952 in coupler 910 according to embodiments of the present invention. Heating device 952 can function similarly to heating element 638 with all control methods as discussed above with regards to FIGS. 6A–6D. EUV light causes heat to be absorbed at 932 by reticle 202. The heat is transferred by conduction through reticle 202, gas 210, chuck front plate 902, heat shunts 908, and coupler (e.g., SS IR coupler) 910. To maintain a constant head load, electric heater 952 is positioned near or in coupler 910. As discussed above, heat is added inversely with respect to the absorbed actinic heat. Next, through constant radiation at 956 heat is transferred from coupler 910 to a long stroke stage (LS) radiative coupler (e.g., LS IR coupler) 936. Finally, through constant convection at 958, heat is removed from the long stroke stage by coolant 940, as is described above.

F. Reticle Holding System Using a Heat Spreader Between a Front Plate and Heat Shunts FIGS. 10A and 10B show a cross sectional and an exploded cross sectional view, respectively, of a portion 1000 of a short stroke stage in a lithography tool according to preferred embodiments of the present invention. Portion 1000 includes a front plate 1002 having first protrusions (e.g., burls) 1004 and second protrusions (e.g., a reticle to chuck seal plateau) 1006. Portion 1000 also includes a uniform heat spreader (e.g., a heat spreader plate or a heat spreading device) 1008 having holes 1010. Shunts 1012 are coupled to heat spreader plate 1008. Portion 1000 further includes a honeycomb structure 1014 having first extensions (e.g., bosses) 1016 that are positioned in holes 1010 and second extensions (e.g., a honeycomb to front plate seal plateau) 1018. Honeycomb structure 1014 also has a groove (e.g., an elastomer seal groove) 1020 that receives a sealing device (e.g., an elastomer seal) 1022. Holding devices (e.g., caps) 1024 are coupled to honeycomb 1014 to hold resilient devices (e.g., compression springs) 1026 on shunts 1012. Compression springs 1026 for maintaining heat spreader 1008 in close proximity to front plate 1002 are compressed against extensions 1028 that extend from shunts 1012 when springs 1026 are held by caps 1024. A coupler base plate 1030 is positioned to hold sealing device 1022 in groove 1020. Coupler base plate 1030 includes extensions 1032 (e.g. SS IR coupler fins) that are used to radiate heat from the short stroke stage to the long stroke stage.

FIGS. 10C and 10D show an exploded view and a zoomed in exploded view, respectively, of portion 1000 and a portion 1040 of a short and long stroke stage system in a lithography tool according to preferred embodiments of the present invention. Portion 1040 includes coupler (e.g., LS IR coupler) 1042 and channels (e.g., coolant fittings) 1044. These elements absorb the radiated heat and remove heat from the long stroke by convection to the fluid circulated through channels 1044. Honeycomb section 1014 includes holes 1046 that receive shunts 1012, springs 1026, and caps 1024. Also, FIG. 10D shows how bosses 1016 are received by openings 1010 and a counter bore 1048 for caps 1024.

As seen in FIG. 10E, there are five main interfaces A–E that must be coupled together, while taking into consideration distortion caused by unequal material properties (e.g., CTE) of materials being coupled and other limitations. Some or all of these interfaces and ways of coupling them apply to other ones of the embodiments discussed above and below. The elements are not numbered in the figure for convenience. A first interface A is between heat spreader 1008 and shunt 1012. In some embodiments, a high temperature braze or solder can be used to couple these elements to achieve a stable bond impervious to temperatures applied in subsequent bonding steps. A second interface B is between front plate 1002 and honeycomb section 1014. In some embodiments, a medium temperature solder can be used to couple these elements without affecting existing interface A. A third interface C is between honeycomb section 1014 and cap 1024. Again, in some embodiments a medium temperature solder can be used to couple these elements possibly in the same process step that creates interface B. A fourth interface D is between honeycomb device 1014 and coupler base plate 1030. In some embodiments, a low temperature solder or epoxy can be used to couple these elements without affecting previously formed interfaces A, B and C.

With reference to FIGS. 10F–10H, and continuing reference to FIG. 10E, a fifth interface E is between front plate 1002 and heat spreader 1008. Whereas all previous interfaces couple like materials (e.g., low CTE to low CTE or high CTE to high CTE), interface E couples dissimilar materials (e.g., low CTE chuck front plate to high CTE heat spreader). For this interface, a coupling material must have high thermal conductivity, while allowing expansion at different rates.

FIG. 10F shows gas being used between front plate 1002 and heat spreader 1008. Although gas can be used, it has several limitations: (1) gas requires very flat (e.g., flatness within 5 μm of ideal) mating surfaces for good thermal performance; (2) gas provides no lubrication under static conditions, so surfaces may stick together and drag on each other as they expand, causing distortion; (3) elastomer seal 1022 is indispensable to keep the gas from leaking to the vacuum; and (4) gas pressure is sensitive to temperature and variations in gas pressure may cause chuck 1002 to distort.

FIG. 10G shows a viscous material (e.g., a liquid or a paste) being used between front plate 1002 and heat spreader 1008. Liquid or paste is slightly better than gas because: (1) they require only moderately flat (e.g., flatness within about 50 μm of ideal) mating surfaces for good thermal performance; (2) they provides lubrication under static conditions if sufficiently viscous/thick (e.g., no micro sticking); (3) elastomer seal 1022 can be eliminated if sufficiently low partial pressure liquid/paste is found (e.g., high vacuum grade grease); and (4) there is negligible chuck distortion due to changes in chuck internal pressure.

FIG. 10H shows a conforming elastic sheet being used between plate 1002 and heat spreader 1008. The sheet is slightly better than gas, liquid, or paste because: (1) it requires only moderately flat mating surfaces for good thermal performance (e.g., flatness within about 50 mm of ideal); (2) micro-sticking is not an issue since sheet will easily deform without applying large lateral drag forces on the other parts; (3) elastomer seal 1022 can be eliminated; (4) there is little or no distortion due to changes in chuck internal pressure; and (5) if the sheet is bonded to front plate 1002 and to heat spreader 1008, keeping them together, the springs and caps can be eliminated.

FIG. 10I shows heat flow 1060 through a system with portions 1000 and 1040 according to preferred embodiments of the present invention. EUV light causes heat to be absorbed at 1062 by reticle 202. The heat is transferred by conduction through reticle 202, gas 210, chuck front plate 1002, heat spreader 1008, heat shunts 1012, and coupler (e.g., SS IR coupler) 1064, which includes coupler base plate 1030 and fins 1032. Next, through radiation at 1066 heat is transferred from coupler 1064 to a long stroke stage (LS) radiative coupler (e.g., LS IR coupler) 1042. Finally, through convection at 1068, heat is removed from the long stroke stage by coolant 1070, as is described above.

FIG. 10J shows heat flow 1080 through a system with a modified portion 1000 and 1040. Modified portion 1000 includes a heating device 1082 coupled to or in heat spreader 1008, where heating device 1082 is similar to that discussed above with respect to FIGS. 6B and 9D. Also, the heating is similar to the discussion for FIGS. 6B and 9D. EUV light causes heat to be absorbed at 1062 by reticle 202. The heat is transferred by conduction through reticle 202, gas 210, chuck front plate 1002, heat spreader 1008, heat shunts 1012, and coupler (e.g., SS IR coupler) 1064, which includes coupler base plate 1030 and fins 1032. Compensatory heat is input at 1084 using heater 1082 to maintain the heat spreader at a constant temperature. Next, through constant radiation at 1086 heat is transferred from coupler 1064 to a long stroke stage (LS) radiative coupler (e.g., LS IR coupler)

1042. Finally, through constant convection at 1088, heat is removed from the long stroke stage by coolant 1070, as is described above.

G. Reticle Holding System Having No Front Plate and Using a Heat Spreader that Holds the Reticle Directly FIGS. 11A and 11B show cross sectional and exploded cross sectional views of a portion 1100 of a short stroke stage in a lithography tool according to embodiments of the present invention. Portion 1100 includes a heat spreader plate 1102 having extensions (e.g., shunts) 1104 and holes (e.g., burl receiving holes) 1106. Portion 1100 also includes honeycomb structure 1108 that has elongated members 1110 with ends (e.g., burls) 1112 and extension (e.g., reticle to chuck seal plateau) 1114. Honeycomb 1108 also has groove (e.g., a seal receiving grove) 1116 that receives a sealing device (e.g., an elastomer seal) 1118 and extensions (e.g., blade coupling devices) 1120 that are coupled to blade flexures 1122. Blade flexures 1122 are also coupled to extensions (e.g., blade coupling devices) 1124 that are coupled to a coupled base plate (e.g., SS IR-coupler base plate) 1126 and extensions (e.g., SS IR coupler fins) 1128 extending from base plate 1126.

FIG. 11C shows heat flow 1140 through a system with portion 1100 according to embodiments of the present invention. EUV light causes heat to be absorbed at 1142 by reticle 202. The heat is transferred by conduction through reticle 202, gas 210, heat spreader 1102, heat shunts 1104, and coupler (e.g., SS IR coupler) 1144, which includes coupler base plate 1126 and fins 1128. Next, through radiation at 1146 heat is transferred from coupler 1044 to a long stroke stage (LS) radiative coupler (e.g., LS IR coupler) 1148. Finally, through convection at 1150, heat is removed from the long stroke stage by coolant 1152, as is described above.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A short stroke stage for use in a lithography system, comprising:
   a radiative coupler having a base plate coupled to a first plurality of extensions, the radiative coupler comprised of a conductive material;
   a rigid structure having a plurality of struts with tips, the rigid structure comprised of a substantially zero coefficient of thermal expansion material;
   an electrostatic chuck having a heat spreader plate coupled to a second plurality of extensions that mechanically couple the electrostatic chuck to the radiative coupler base plate, the heat spreader plate having a plurality of holes to allow the tips of the rigid structure struts to pass there through so as to support the substrate; and
   flexures that mechanically couple the radiative coupler to the rigid structure,
   wherein during operation, the electrostatic chuck secures a substrate, such as a wafer or a reticle, within the lithography system, and the electrostatic chuck and radiative coupler are thermally coupled so as to conduct heat away from the substrate.

2. The short stroke stage of claim 1, wherein said rigid structure is made of ultra low expansion glass.

3. The short stroke stage of claim 1, wherein said rigid structure is made of low expansion ceramic.

4. The short stroke stage of claim 1, wherein said radiative coupler heat removal portion is made of at least one material from the group consisting of aluminum nitride, silicon carbide, aluminum, copper, and silver.

5. The short stroke stage of claim 1, wherein said heat spreader plate is coupled to an electric heater to maintain a constant temperature for said heat spreader.

6. The short stroke stage of claim 5, wherein said electric heater is a thin-film resistor fabricated on a surface of said heat spreader plate.

7. The short stroke stage of claim 1, wherein the first plurality of extensions, the second plurality of extensions, and the rigid structure struts are substantially parallel.

8. The short stroke stage of claim 1, wherein the first plurality of extensions, the second plurality of extensions, and the rigid structure struts are substantially perpendicular to the base plate and the heat spreader plate.

* * * * *

UNITED STATES PATENT AND TRADEMARK OFFICE
CERTIFICATE OF CORRECTION

PATENT NO.       : 7,105,836 B2
APPLICATION NO. : 10/273405
DATED            : September 12, 2006
INVENTOR(S)      : del Puerto et al.

It is certified that error appears in the above-identified patent and that said Letters Patent is hereby corrected as shown below:

Title Page

Item [56], References Cited, OTHER PUBLICATIONS, please add --English Abstract for Japanese Patent Publication No. 10209042, supplied by the European Patent Office, 1 page.--.

Item [56], References Cited, OTHER PUBLICATIONS, please add --Partial European Search Report from European Patent Application No. 0302362.4, dated February 25, 2005, 5 pages.--.

Signed and Sealed this

Ninth Day of January, 2007

JON W. DUDAS
*Director of the United States Patent and Trademark Office*